US010424490B2

(12) United States Patent
Kim et al.

(10) Patent No.: US 10,424,490 B2
(45) Date of Patent: Sep. 24, 2019

(54) HARDMASK COMPOSITION, METHOD OF FORMING PATTERN USING THE HARDMASK COMPOSITION, AND HARDMASK FORMED FROM THE HARDMASK COMPOSITION

(71) Applicant: Samsung Electronics Co., Ltd., Suwon-si, Gyeonggi-do (KR)

(72) Inventors: Sangwon Kim, Seoul (KR); Minsu Seol, Suwon-si (KR); Hyeonjin Shin, Suwon-si (KR); Dongwook Lee, Suwon-si (KR); Seongjun Jeong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/805,848

(22) Filed: Nov. 7, 2017

(65) Prior Publication Data
US 2018/0179397 A1    Jun. 28, 2018

(30) Foreign Application Priority Data

Dec. 27, 2016 (KR) .................. 10-2016-0180136

(51) Int. Cl.
*H01L 21/308* (2006.01)
*C09D 1/00* (2006.01)
(Continued)

(52) U.S. Cl.
CPC .......... *H01L 21/3081* (2013.01); *C01B 32/15* (2017.08); *C01B 32/152* (2017.08); *C01B 32/156* (2017.08); *C01B 32/184* (2017.08); *C08K 3/04* (2013.01); *C08K 3/042* (2017.05); *C08K 3/045* (2017.05); *C08K 9/04* (2013.01); *C09D 1/00* (2013.01); *C09D 7/62* (2018.01); *C09D 7/67* (2018.01); *G03F 7/2004* (2013.01);
(Continued)

(58) Field of Classification Search
None
See application file for complete search history.

(56) References Cited

U.S. PATENT DOCUMENTS

2011/0195362 A1    8/2011  Watanabe et al.
2015/0010703 A1*   1/2015  Frommhold ............. C09C 1/44
                                                        427/240
(Continued)

FOREIGN PATENT DOCUMENTS

CN    104762122    *  7/2015  .......... C10M 125/00
EP    2812391 A1   12/2014
(Continued)

OTHER PUBLICATIONS

Z. Liu et al., J. Phys. Chem. B, vol. 113, pp. 9681-9686. (Year: 2009).*
(Continued)

*Primary Examiner* — Jiong-Ping Lu
(74) *Attorney, Agent, or Firm* — Harness, Dickey & Pierce, P.L.C.

(57) ABSTRACT

Provided are a hardmask composition and a method of forming a fine pattern using the hardmask composition, the hardmask composition including a solvent, a 2D carbon nanostructure (and/or a derivative thereof), and a 0D carbon nanostructure (and/or a derivative thereof).

26 Claims, 12 Drawing Sheets

(51) Int. Cl.

| | |
|---|---|
| *C08K 3/04* | (2006.01) |
| *C08K 9/04* | (2006.01) |
| *G03F 7/20* | (2006.01) |
| *G03F 7/32* | (2006.01) |
| *G03F 7/40* | (2006.01) |
| *C09D 7/62* | (2018.01) |
| *C09D 7/40* | (2018.01) |
| *C01B 32/15* | (2017.01) |
| *C01B 32/152* | (2017.01) |
| *H01L 21/02* | (2006.01) |
| *H01L 21/033* | (2006.01) |
| *H01L 21/311* | (2006.01) |
| *C01B 32/184* | (2017.01) |
| *C01B 32/156* | (2017.01) |
| *G03F 7/09* | (2006.01) |

(52) U.S. Cl.
CPC ............ *G03F 7/2006* (2013.01); *G03F 7/322* (2013.01); *G03F 7/40* (2013.01); *H01L 21/02115* (2013.01); *H01L 21/0332* (2013.01); *H01L 21/3086* (2013.01); *H01L 21/31144* (2013.01); *C08K 2201/005* (2013.01); *G03F 7/094* (2013.01)

(56) References Cited

U.S. PATENT DOCUMENTS

| | | | |
|---|---|---|---|
| 2015/0348794 A1* | 12/2015 | Kim | H01L 21/324 438/703 |
| 2016/0005625 A1 | 1/2016 | Shin et al. | |
| 2016/0011511 A1 | 1/2016 | Shin et al. | |
| 2016/0027645 A1 | 1/2016 | Shin et al. | |
| 2016/0211142 A1 | 7/2016 | Kim et al. | |
| 2017/0040178 A1 | 2/2017 | Kim et al. | |
| 2017/0271154 A1 | 9/2017 | Shin et al. | |
| 2017/0278703 A1 | 9/2017 | Robinson et al. | |

FOREIGN PATENT DOCUMENTS

| | | |
|---|---|---|
| EP | 2950334 A1 | 12/2015 |
| JP | 5757286 B2 | 7/2015 |
| KR | 20160100172 A | 8/2016 |
| WO | WO-2013/117908 A1 | 8/2013 |
| WO | WO-2016/058008 A2 | 4/2016 |
| WO | WO-2016/0129927 A1 | 8/2016 |

OTHER PUBLICATIONS

T. Gan et al., Electrochinnica Acta, vol. 111, pp. 738-745. (Year: 2013).*
X. Zhang et al., Carbon, vol. 47, pp. 313-347. (Year: 2008).*
Extended European Search Report dated May 24, 2018 issued in European Application No. 17200667.8.
Zhenghong Guo et. al.; "Fabrication of fullerene-decorated graphene oxide and its influence on flame retardancy of high density polyethylene"; 2016; Composites Science and Technology; vol. 129; pp. 123-129.
Rachana Kumar et. al.; "Fullerene grafted graphene oxide with effective charge transfer interactions"; 2016 Carbon; vol. 107; pp. 765-773.
Yue Zhang et. al; "Functionalization of graphene sheets through fullerene attachment"; 2011; Journal of Materials Chemistry; vol. 2; pp. 5386-5391.
Zhi-Bo Liu et al.; "Porphyrin and Fullerene Covalently Functionalized Graphene Hybrid Materials with Large Nonlinear Optical Properties"; 2009; J. Phys. Chem. B; vol. 113; pp. 9681-9686.
Xiaoyan Zhang et. al.; "Synthesis and Characterization of a Graphane-C60 Hybrid Material"; 2008; Carbon; vol. 47; pp. 3334-3337.
Andreas Frommhold et. al.; "Spin-on carbon based on fullerene derivatives as hardmask materials for high-aspect-ratio etching"; Jun.-Sep. 2013; J. Micro/Nanolith. MEMS MOEMS; vol. 12(3).

* cited by examiner

HARDMASK COMPOSITION, METHOD OF FORMING PATTERN USING THE HARDMASK COMPOSITION, AND HARDMASK FORMED FROM THE HARDMASK COMPOSITION

CROSS-REFERENCE TO RELATED APPLICATION

This application claims the benefit of Korean Patent Application No. 10-2016-0180136, filed on Dec. 27, 2016, in the Korean Intellectual Property Office, the disclosure of which is incorporated herein in its entirety by reference.

BACKGROUND

1. Field

The present disclosure relates to a hardmask composition, a method of forming a pattern, and a hardmask formed from the hardmask composition.

2. Description of the Related Art

The semiconductor industry has developed an ultrafine technique for providing a pattern having a size of several to several tens of nanometers. Such an ultrafine technique benefits from effective lithographic techniques. A typical lithographic technique includes providing a material layer on a semiconductor substrate, coating a photoresist layer on the material layer, exposing and developing the same to provide a photoresist pattern, and etching the material layer using the photoresist pattern as a mask.

In order to minimize or reduce the pattern to be formed, it may be difficult to provide a fine pattern having a desirable profile by only using the typical lithographic technique described above. Accordingly, a layer, called "a hardmask", may be formed between the material layer for etching and the photoresist layer to provide a fine pattern. The hardmask serves as an interlayer that transfers the fine pattern of the photoresist to the material layer through a selective etching process. Thus, the hardmask layer needs to have chemical resistance, thermal resistance, and etching resistance, so that it may tolerate various types of etching processes.

As semiconductor devices have become highly integrated, a height of a material layer has been maintained the same or has increased, but a line-width of the material layer has gradually narrowed. Thus, an aspect ratio of the material layer has increased. Because an etching process needs to be performed under such conditions, the heights of a photoresist layer and a hardmask pattern also need to be increased. However, there is a limit to the extent to which the heights of a photoresist layer and a hardmask pattern may be increased. In addition, the hardmask pattern may be damaged during the etching process for obtaining a material layer with a narrow line-width, and thus electrical characteristics of the devices may deteriorate.

In this regard, methods have been proposed which use a single layer or multiple layers, in which a plurality of layers of a conductive or insulating material are stacked, e.g., a polysilicon layer, a tungsten layer, and a nitride layer, as a hardmask. However, the single layer or the multiple layers require a relatively high deposition temperature, and thus physical properties of the material layer may be modified. Therefore, a novel hardmask material is needed.

SUMMARY

Provided is a hardmask composition with improved etching resistance.

Provided is a method of forming a pattern using the hardmask composition.

Provided is a hardmask formed from the hardmask composition.

Additional aspects will be set forth in part in the description which follows and, in part, will be apparent from the description, or may be learned by practice of the presented embodiments.

According to some example embodiments, a hardmask composition includes a solvent and at feast one of a derivative mixture and a composite. The derivative mixture may include a derivative of a two-dimensional (2D) carbon nanostructure and a derivative of a zero-dimensional (0D) carbon nanostructure. The composite may include a 2D carbon nanostructure and a 0D carbon nanostructure.

According to some example embodiments, a method of forming a pattern includes: forming an etching layer on a substrate; forming a hardmask on the etching layer, the forming the hardmask including providing the hardmask composition on the etching layer, wherein the hardmask includes a composite containing a 2D carbon nanostructure and a 0D carbon nanostructure; forming a photoresist layer on the hardmask; forming a hardmask pattern, the forming the hardmask pattern including etching the composite using the photoresist layer as an etching mask; and etching the etching layer using the hardmask pattern as an etching mask.

According to some example embodiments, a hardmask includes a composite containing a 2D carbon nanostructure and a 0D carbon nanostructure.

According to some example embodiments, a hardmask composition includes at least one of a two-dimensional (2D) carbon nanostructure and a derivative of the 2D carbon nanostructure. The hardmask composition further includes at least one of a zero-dimensional (0D) carbon nanostructure and a derivative of the 0D carbon nanostructure.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
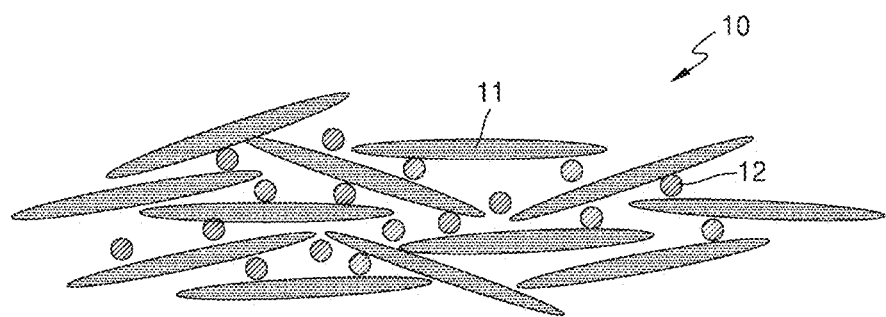
FIG. 1 is a schematic diagram that illustrates a structure of a composite, according to one or more example embodiments, that may be used as a hardmask and includes a two-dimensional (2D) carbon nanostructure and a zero-dimensional (0D) carbon nanostructure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items.

Hereinafter, a hardmask composition according to one or more example embodiments, a method of forming a pattern using the hardmask composition, and a hardmask formed from the hardmask composition will be described in detail.

A hardmask composition may include a solvent and i) a derivative mixture including a derivative of a two-dimensional (2D) carbon nanostructure and a derivative of a zero-dimensional (0D) carbon nanostructure; and/or ii) a composite including the 2D carbon nanostructure and the 0D carbon nanostructure. In other words, the hardmask composition may include the solvent and at least one of the derivative mixture and the composite.

The term "derivative" is an analogous compound that is obtained by chemically modifying the a two-dimensional (2D) carbon nanostructure or the zero-dimensional (0D) carbon nanostructure. The 2D carbon nanostructure and the 0D carbon nanostructure may be classified according to the manner in which carbon atoms are connected. The definitions thereof are as follows.

The term "2D carbon nanostructure" as used herein refers to a sheet structure of a single atomic layer formed by a carbon nanostructure that forms polycyclic aromatic molecules in which a plurality of carbon atoms are covalently bound and aligned into a planar shape; a network structure in which a plurality of carbon structures each having a plate shape as a small film piece are interconnected and aligned into a planar shape; or a combination thereof. The covalently bound carbon atoms form repeating units that include 6-membered rings, but may also form 5-membered rings and/or 7-membered rings. The 2D carbon nanostructure may be formed by stacking a plurality of layers including several sheet structures and/or network structures, and an average thickness of the 2D carbon nanostructure may be about 100 nanometers (nm) or less, for example, about 10 nm or less, or in a range of about 0.01 nm to about 10 nm.

The 2D carbon nanostructure may be a graphene nanoparticle (GNP) having a size in a range of about 1 nm to about 10 nm, for example, about 5 nm to about 8 nm, and the number of layers of the GNP is about 300 or less.

The 2D carbon nanostructure may have a 2D sheet form, a ratio of size to thickness thereof may be in a range of about 3 to about 30, for example, about 5 to about 25. When the 2D carbon nanostructure has a plate-like shape, the term "size" denotes a longitudinal length of the 2-dimensional flat shape. When the 2D carbon nanostructure has an oval shape, the term "size" may denote a major axis diameter.

For example, the 2D carbon nanostructure may be at least one of graphene, graphene quantum dots, reduced graphene oxide, and a heteroatom derivative thereof.

The term "0D carbon nanostructure" as used herein may include, for example, fullerenes (C20, C26, C28, C36, C50, C60, C70, and C2n, where n=12, 13, 14, or 100), boron buckyballs (B80, B90, and B92), a carborane ($C_2B_{10}H_{12}$), and a derivative thereof. A particle size of the 0D carbon nanostructure may be in a range of about 0.6 nm to about 2 nm.

The 0D carbon nanostructure may be, for example, fullerene having a particle size of about 1 nm or less, for example, about 0.7 nm to about 1 nm; and a density in a range of about 1.5 grams per cubic centimeter ($g/cm^3$) to about 1.8 $g/cm^3$, for example, about 1.7 $g/cm^3$. All fullerenes have $sp^2$ carbon.

The number of carbon atoms of the 0D carbon nanostructure may be 26 or greater, for example, 60 or greater, for example, 60, 70, 76, 78, 80, 82, or 84.

The term "heteroatom derivative" as used herein refers to a derivative that contains a heteroatom, e.g., boron (B) or nitrogen (N).

The 2D carbon nanostructure may be, for example, at least one of graphene, graphene quantum dots, graphene nanoparticles, reduced graphene oxide, and a heteroatom derivative thereof.

The 2D carbon nanostructure may have, for example, a 2D sheet form, a ratio of size to thickness thereof may be in a range of about 3 to about 30.

The term "derivative of a 2D carbon nanostructure" as used herein refers to a precursor of a 2D carbon nanostructure or a 2D carbon nanostructure having a reactive functional group. The term "derivative of a 0D carbon nanostructure" as used herein refers to a precursor of a 0D carbon nanostructure or a 0D carbon nanostructure having a reactive functional group. For example, when a 0D carbon nanostructure is fullerene, a derivative of the 0D carbon nanostructure may be a start material for fullerene, or fullerene having a reactive functional group such as OH-functionalized fullerene. When a 2D carbon nanostructure is a GNP, a derivative of the 2D carbon nanostructure refers to a GNP having a reactive functional group such as a COOH-functionalized GNP, or a start material for a GNP.

A COOH-functionalized GNP may be obtained by adding chloroacetic acid to a bare GNP or a OH functionalized GNP.

A OH-functionalized GNP may be obtained by a known method of introducing a hydroxyl group to a GNP. For example, the OH-functionalized fullerene may be obtained by grinding fullerene to a predetermined or given size followed by addition of a base and a oxidizing agent and grinding the mixture. Examples of the base include sodium hydroxide. Examples of the oxidizing agent include hydrogen peroxide.

The composite may be a structure in which a 2D carbon nanostructure is bound to a 0D carbon nanostructure via a linker; or a laminate of the 2D carbon nanostructure and the 0D carbon nanostructure.

The composite may be a molecular composite, a covalent bonded structure, or a laminate.

The term "laminate of the 2D carbon nanostructure and the 0D carbon nanostructure" as used herein refers to a structure in which the 2D carbon nanostructure and the 0D carbon nanostructure are stacked. The term "molecular composite" as used herein refers to a composite form in which elements thereof are well-mixed in molecular unit such as a single compound.

A hardmask may include the composite containing the 2D carbon nanostructure and the 0D carbon nanostructure. Because the composite has improved density relative to a 2D carbon nanostructure such as a GNP, the hardmask including the composite may have improved etching resistance relative to a hardmask including a GNP only.

A mixture ratio of the 2D carbon nanostructure to the 0D carbon nanostructure in the composite may be in a range of about 1:1 to about 99:1, for example, about 50:50 to about 90:10, for example, about 3:1 to about 5:1. When the mixture ratio of the 2D carbon nanostructure to the 0D carbon nanostructure in the composite is within any of these ranges, a hardmask composition may have a desirable solubility, and when this hardmask composition is used, a hardmask having improved film uniformity and etching resistance may be prepared.

FIG. 1 is a schematic diagram that illustrates a structure of a composite, according to one or more example embodiments, that may be used as a hardmask and includes a 2D carbon nanostructure and a 0D carbon nanostructure. In FIG. 1, the 2D carbon nanostructure may be, for example, a GNP (having a particle size in a range of about 7 nm to about 8 nm), and the 0D carbon nanostructure may be, for example, fullerene, but example embodiments are not limited thereto.

Referring to FIG. 1, a composite 10 has a structure in which fullerene 12 is present between a plurality of 2D carbon nanostructures, e.g., GNPs 11, as a complex. The GNPs 11 and the fullerene 12 may form covalent bonds through a coupling reaction and be bound to each other via these covalent bonds. The composite 10 having such a structure may have an excellent density in a range of about 1.6 g/cm$^3$ to about 1.8 g/cm$^3$ because the fullerene 12 complements micropores of the GNPs 11. In addition, excellent solubility of the GNPs 11 and etching resistance of the fullerene 12 may exhibit a synergistic effect, and thus, a hardmask prepared using the composite may have improved etching resistance.

In the composite 10, the 2D carbon nanostructure may be bound to the 0D carbon nanostructure by a linker. The linker may be derived from reactive functional groups included in the 2D carbon nanostructure and the 0D carbon nanostructure. For example, the 2D carbon nanostructure may include a first reactive functional group and the 0D carbon nanostructure may include a second reactive functional group, which may be the same as or different than the first reactive functional group.

The reactive functional group (e.g., first reactive functional group and/or second reactive functional group) may be any suitable functional group that enables a coupling reaction between the 2D carbon nanostructure and the 0D carbon nanostructure. Examples of the reactive functional group (e.g., first reactive functional group and/or second reactive functional group) may include at least one of a halogen atom, a hydroxyl group, an alkoxy group, a cyano group, an amino group, an azide group, a carboxamidine group, a hydrazino group, a hydrazono group, a carbamoyl group, a thiol group, an ester group, a carboxylic acid group or a salt thereof, a sulfonic acid group or a salt thereof, and a phosphoric acid group or a salt thereof.

The linker may be one of an ester group (—C(=O)O—), an ether group (—O—), a thioether group (—S—), a carbonyl group ((—C)=O)—), an amide group (—C(=O)NH—), an imide group, and an organic group derived therefrom.

The composite may be a product of a reaction between the 2D carbon nanostructure having a reactive functional group and the 0D carbon nanostructure having a reactive functional group.

According to analysis of the fullerene by Raman spectroscopy, a maximum absorption peak may be observed at a Raman shift of about 1,455 centimeters$^{-1}$ (cm$^{-1}$) to about 1,500 cm$^{-1}$. This peak corresponds to a pentagonal pinch mode, which indicates that fullerene is included in the composite.

The composite may be, for example, a composite represented by Formula 1, a composite represented by Formula 2, or a composite represented by Formula 3:

A-C(=O)—O—B.  Formula 1 wherein, in Formula 1, A indicates fullerene, B indicates graphene and a linker is —O—C(=O)—O—, The composite represented by Formula 1 may be a product of a reaction between graphene to which a hydroxyl group is bound and fullerene to which a carboxyl group is bound,

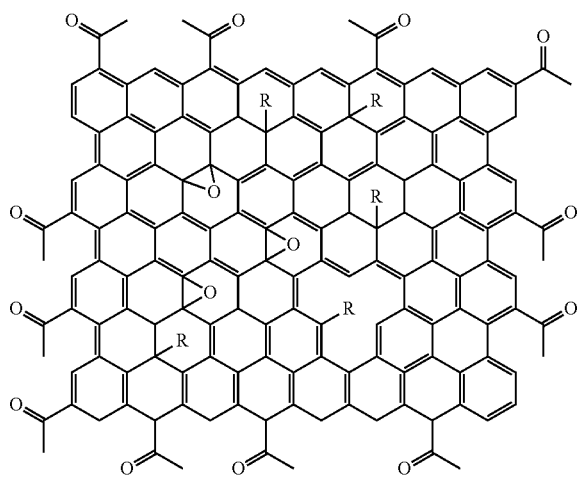

Formula 2 wherein in Formula 2, R indicates a group represented by Formula 2a:

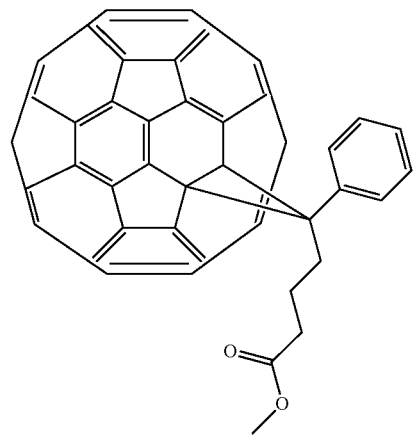

Formula 2a

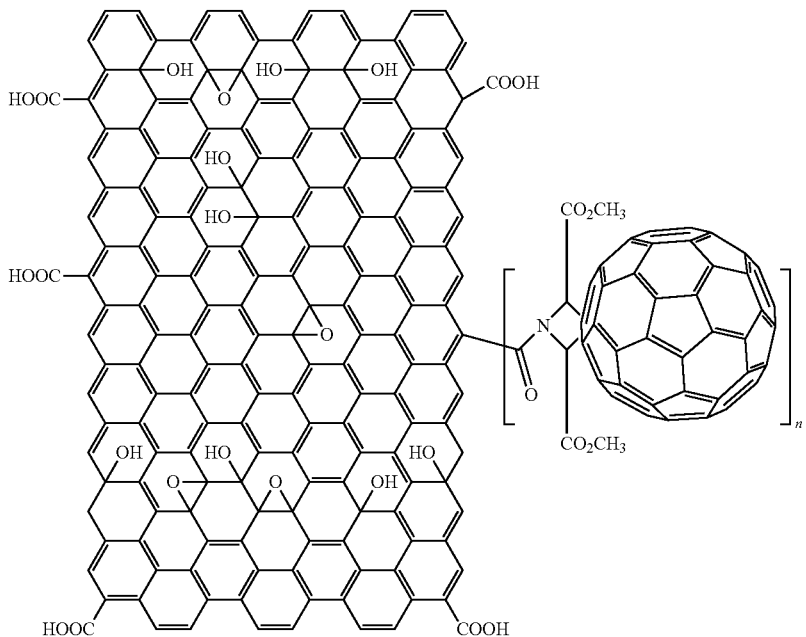

Formula 3 wherein, in Formula 3, n may be an integer from 1 to 10, for example, 1.

The GNP used as a 2D carbon nanostructure may have a 2D plate-like shape or a spherical shape. For example, the GNP may have a spherical shape. Here, the term "spherical" denotes all types of shape that is substantially close to a sphere. For example, the spherical shape may be a spherical shape or an oval shape.

When the GNP has a spherical shape, the term "size" denotes an average particle diameter of the GNP. When the GNP has a plate-like shape, the term "size" denotes a longitudinal length of the 2-dimensional flat shape. When the GNP has an oval shape, the term "size" may denote a major axis length. A size of the GNP may be in a range of about 1 nanometers (nm) to about 10 nm, for example, about 5 nm to about 10 nm, or about 7 nm to about 8 nm. When a size of the GNP is within any of these ranges, an amount of the edge carbon is greater than 20 atom % based on the total amount of carbon of the GNP, and thus an etching rate of a hardmask formed from the hardmask composition may be excessively high. Also, when a size of the GNP is within any of these ranges, an etching rate of the hardmask may be appropriately controlled, and dispersibility of the GNP in the hardmask composition may be improved.

The number of layers of the GNP may be 300 or less, for example, 100 or less, or in some embodiments, in a range of about 1 to about 20. Also, a thickness of the GNP may be about 100 nm.

When a size, the number of layers, and a thickness of the GNP are within any of these ranges above, the hardmask composition may have improved stability.

The GNP contains an edge carbon (edge C) existing at an edge site and a center carbon (center C) existing at a center site. The edge carbon has an sp$^a$ bonding structure, and the center carbon has an sp$^2$ bonding structure. Since a functional group (e.g., oxygen or nitrogen) may be bound to the edge carbon, reactivity of the edge carbon with respect to an etching solution may be greater than that of the center carbon.

In a GNP according to one or more example embodiments, an amount of the edge carbon may be about 20 atom % or less, for example, in a range of about 1.2 atom % to about 19.1 atom %.

In the GNP, an amount of the edge carbon and the center carbon may be calculated using a carbon-carbon bond length in the GNP.

An amount of oxygen contained in the GNP may be in a range of about 0.01 atom % to about 40 atom %. An amount of oxygen may be in a range of about 6.5 atom % to about 19.9 atom %, for example, about 10.33 atom % to about 14.28 atom %. The amount of oxygen may be measured using, for example, an X-ray photoelectron spectroscopy (XPS) analysis. When the amount of oxygen is within any of these ranges, degassing may not occur during an etching process of the hardmask formed from the hardmask composition, and the hardmask may have desirable etching resistance. When the amount of oxygen of the GNP is within any of these ranges, the GNP has hydrophilic property, and thus an adhesive strength of the GNP to another layer may improve. Also, solvent dispersibility of the GNP improves, and thus a hardmask composition may be more easily manufactured. In addition, etching resistance with respect to an etching gas may improve due to a high bond dissociation energy of the functional group including an oxygen atom.

Each of D50, D90, and D10 of the GNPs denotes a particle size when the GNPs are accumulated at a volume ratio of 50%, 90%, or 10%. Here, a particle size may refer to an average particle diameter when the GNPs have a spherical shape, or a longitudinal length when the GNPs do not have a spherical shape (e.g., have an oval or a rectangular shape).

In a hardmask according to one or more example embodiments, light scattering does not occur in a range of visible light, and a transmittance of the hardmask at a wavelength of about 633 nm is about 99% or higher. When a hardmask having improved transmittance as such is used, sensing of a hardmask pattern and an align mask for patterning an etching layer may become easier, and thus the etching layer may be patterned at a finer and more compact pattern size.

The GNPs contained in the hardmask may have k that is 0.5 or lower, for example, about 0.3 or lower, or in some embodiments, 0.1 or lower, at a wavelength of about 633 nm. For comparison, k of graphite is in a range of about 1.3 to about 1.5, and k of graphene, which is only formed of an $sp^2$ bond structure, is in a range of about 1.1 to about 1.3.

k is an extinction coefficient which is measured using a spectroscopic ellipsometer. When k of the GNPs is within the range above, and a hardmask formed using the GNPs is used, an align mark may be more easily sensed.

The total thickness of the GNP may be, for example, in a range of about 0.34 nm to about 100 nm. When GNPs have a thickness as such, the GNPs may have a stable structure. A GNP according to one or more example embodiments includes some oxygen atoms in addition to carbon atoms, rather than having a complete C=C/C—C conjugated structure. Also, a carboxyl group, a hydroxyl group, an epoxy group, or a carbonyl group may be present at the terminus of a 2-dimensional carbon nanostructure in the GNP.

The GNP may have improved solvent dispersibility, and thus manufacture of a hardmask composition with improved stability is convenient. Also, the GNP may improve etching resistance against an etching gas.

At least one functional group selected from a hydroxyl group, an epoxy group, a carboxyl group, a carbonyl group, an amine group, and an imide group may be bound at the terminus of the GNP. When the functional group is bound at the terminus of the GNP as described above, etching resistance of a hardmask formed from the hardmask composition may be better than that of a hardmask in which the functional group is present in the center of the GNP as well as at the terminus of the GNP.

An amount of the GNPs is in a range of about 0.1 percent by weight (wt %) to about 40 wt %. When the amount of the graphene nanoparticles is within this range, the GNP may have improved stability and etching resistance.

The GNP according to one or more example embodiments may have peaks observed at about 1,340 $cm^{-1}$ to about 1,350 $cm^{-1}$, about 1,580 $cm^{-1}$, and about 2,700 $cm^{-1}$ in Raman spectroscopy analysis. These peaks provide information of a thickness, a crystallinity, and a charge doping status of the GNP. The peak observed at about 1,580 $cm^{-1}$ is a "G mode" peak, which is generated by a vibration mode corresponding to stretching of a carbon-carbon bond. Energy of the "G mode" is determined by a density of excess charge doped in the carbon nanostructure. Also, the peak observed at about 2,700 $cm^{-1}$ is a "2D mode" peak that is useful in the evaluation of a thickness of the GNP. The peak observed at about 1,340 $cm^{-1}$ to about 1,350 $cm^{-1}$ is a "D mode" peak, which appears when an $sp^2$ crystal structure has defects and is mainly observed when many defects are found around edges of a sample or in the sample per se. Also, a ratio of a D peak intensity to a G peak intensity (an D/G intensity ratio) provides information of a degree of disorder of crystals of the GNP.

An intensity ratio ($I_D/I_G$) of a D mode peak to a G mode peak obtained from Raman spectroscopy analysis of the GNPs is 2 or lower, for example, in a range of about 0.001 to about 2.0.

An intensity ratio ($I_{2D}/I_G$) of a 2D mode peak to a G mode peak obtained from Raman spectroscopy analysis of the GNPs is 0.01 or higher. For example, the intensity ratio ($I_{2D}/I_G$) is within a range of about 0.01 to about 1.0, or about 0.05 to about 0.5.

When the intensity ratio of a D mode peak to a G mode peak and the intensity ratio of a 2D mode peak to a G mode peak are within any of these ranges, the GNP may have a relatively high crystallinity and a relatively small defect, and thus a bonding energy increases so that a hardmask formed using the GNP may have desirable etching resistance.

X-ray diffraction analysis using CuKα is performed on the GNP, and as a result of the X-ray diffraction analysis, the GNP may include a 2D layered structure having a (002) crystal face peak. The (002) crystal face peak may be observed within a range of about 20° to about 27°.

An interlayer distance (d-spacing) of the GNP obtained from the X-ray diffraction analysis may be in a range of about 0.3 nm to about 0.7 nm, for example, about 0.334 nm to about 0.478 nm. When the interlayer distance (d-spacing) is within this range, the hardmask composition may have desirable etching resistance.

The GNP may be formed as a single layer of 2D nanocrystalline carbon, or formed by stacking multiple layers of 2D nanocrystalline carbon.

The GNP according to one or more example embodiments has a higher content of $sp^2$ carbon than that of spa carbon and a relatively high content of oxygen, as compared with a conventional amorphous carbon layer. An $sp^2$ carbon bond, e.g., a bond of an aromatic structure, has a higher bonding energy than that of an $sp^3$ carbon bond.

The $sp^3$ structure is a 3-dimensional (3D) bonding structure of diamond-like carbon in a tetrahedral shape. The $sp^2$ structure is a 2D bonding structure of graphite in which a carbon to hydrogen ratio (a C/H ratio) increases and thus may secure resistance to dry etching.

In the 2D carbon nanostructure, an $sp^2$ carbon fraction may be equal to or a multiple of an $sp^3$ carbon fraction. For example, an $sp^2$ carbon fraction may be a multiple of an $sp^3$ carbon fraction by about 1.0 to about 10, or by about 1.88 to 3.42.

An amount of the $sp^2$ carbon atom bonding structure is about 30 atom % or greater, for example, about 39.7 atom % to about 62.5 atom %, in the C1 s XPS analysis. Due to the mixing ratio, bond breakage of the GNP may be difficult because carbon-carbon bond energy is relatively high. Thus, when a hardmask composition including the GNP is used, etching resistance characteristics during the etching process may improve. A bond strength between the hardmask and adjacent layers may also increase.

A hardmask obtained using conventional amorphous carbon mainly includes an $sp^2$-centered carbon atom bonding structure and thus may have desirable etching resistance and relatively low transparency. Therefore, when the hardmasks are aligned, problems may occur, and particles may be generated during a deposition process, and thus a hardmask formed using a diamond-like carbon having an $sp^3$-carbon atom bonding structure has been developed. However, the hardmask has relatively low etching resistance and thus has a limit in process application.

A k value of graphite is in a range of about 1.3 to about 1.5, and a k value of graphene having an $sp^2$ structure is in a range of about 1.1 to about 1.3. A GNP according to one or more example embodiments has a k value that is 1.0 or lower, for example, in a range of about 0.1 to about 0.5 at a predetermined or given wavelength. Thus the GNP has improved transparency. Thus, when a hardmask including the GNP is used, an align mark may be more easily sensed during formation of a pattern of an etching layer. Therefore, the pattern may be more finely and evenly formed, and the hardmask may have desirable etching resistance.

In a hardmask composition according to one or more example embodiments, any suitable solvent capable of dispersing a 2D carbon nanostructure and a 0D carbon nanostructure may be used. For example, the solvent may be at least one of water, an alcohol-based solvent, and an organic solvent.

Examples of the alcohol-based solvent include methanol, ethanol, and isopropanol. Examples of the organic solvent include N,N-dimethylformamide, N-methylpyrrolidone, dichloroethane, dichlorobenzene, dimethylsulfoxide, xylene, aniline, propylene glycol, propylene glycol diacetate, 3-methoxy1,2-propanediol, diethylene glycol, gamma-butyrolactone, acetylacetone, cyclohexanone, propylene glycol monomethyl ether acetate, o-dichlorobenzene, nitromethane, tetrahydrofuran, nitromethane, dimethyl sulfoxide, nitrobenzene, butyl nitrite, methyl cellosolve, ethyl cellosolve, diethylether, diethylene glycol methyl ether, diethylene glycol ethyl ether, dipropylene glycol methyl ether, toluene, hexane, methylethylketone, methyl isobutyl ketone, hydroxymethylcellulose, and heptane.

An amount of the solvent may be in a range of about 100 parts to about 100,000 parts by weight based on 100 parts by weight of the total weight of the 2D carbon nanostructure and the 0D carbon nanostructure. When the amount of the solvent is within this range, the hardmask composition may have an appropriate viscosity and thus may more easily form a layer.

A hardmask composition according to one or more example embodiments may have improved stability.

The hardmask composition may further include a first material selected from a monomer containing an aromatic ring and a polymer containing a repeating unit including the monomer; a second material selected from one of a hexagonal boron nitride, a chalcogenide-based material, and their precursors; or a mixture of the first material and the second material.

The first material may not be combined with the second material, or the first material may be combined to the second material by a chemical bond. The first material and the second material combined by a chemical bond may form a composite structure. The first material and the second material having the aforementioned functional groups may be bound to each other through a chemical bond.

The chemical bond may be, for example, a covalent bond. The covalent bond may include at least one selected from an ester group (—C(=O)O—), an ether group (—O—), a thioether group (—S—), a carbonyl group ((—C)=O)—), and an amide group (—C(=O)NH—).

The first material and the second material may include at least one of a hydroxyl group, a carboxyl group, an amino group, —Si($R_1$)($R_2$)($R_3$) (wherein each of $R_1$, $R_2$, and $R_3$ are independently one of hydrogen, a hydroxyl group, a $C_1$-$C_{30}$ alkyl group, a C1-C30 alkoxy group, a $C_6$-$C_{30}$ aryl group, a $C_6$-$C_{30}$ aryloxy group, or a halogen atom), a thiol group (—SH), —Cl, —C(=O)Cl, —SCH$_3$, a glycidyloxy group, a halogen atom, an isocyanate group, an aldehyde group, an epoxy group, an imino group, a urethane group, an ester group, an amide group, an imide group, an acryl group, a methacryl group, —(CH$_2$)$_n$COOH (wherein n is an integer from 1 to 10), —CONH$_2$, a $C_1$-$C_{33}$ saturated organic group having a photosensitive functional group, and a $C_1$-$C_{30}$ unsaturated organic group having a photosensitive functional group.

The monomer containing an aromatic ring may be at least one of a monomer represented by Formula 4 and a monomer represented by Formula 5:

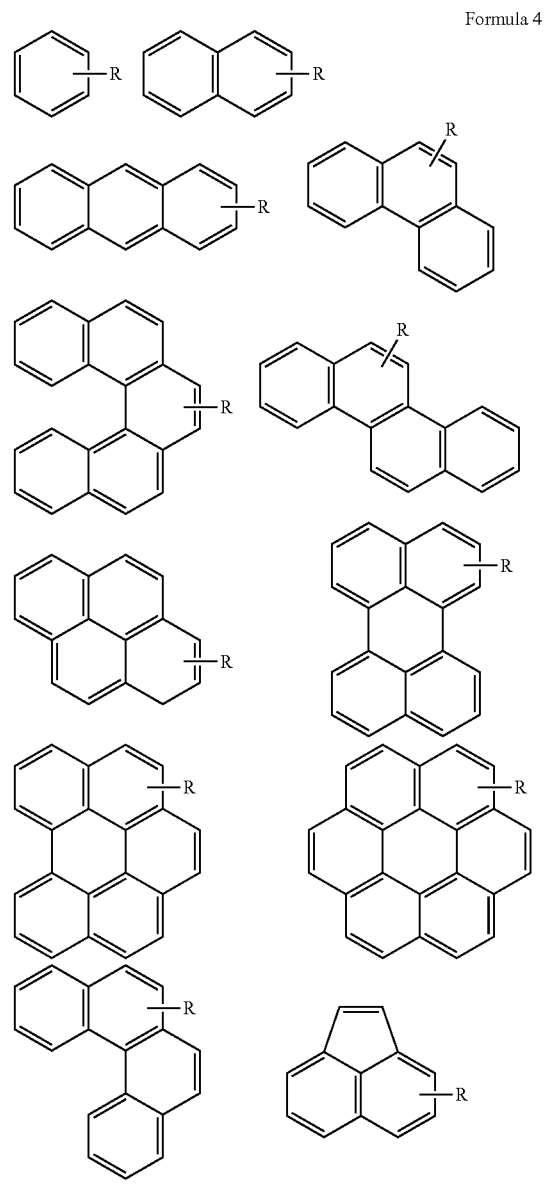

Formula 4 wherein, in Formula 4, R is a mono-substituted or a multi-substituted substituent that is at least one of a general photosensitive functional group, hydrogen, a halogen atom, a hydroxyl group, an isocyanate group, a glycidyloxy group, a carboxyl group, an aldehyde group, an amino group, a siloxane group, an epoxy group, an imino group, a urethane group, an ester group, an epoxy group, an amide group, an imide group, an acryl group, a methacryl group, a substituted or unsubstituted C1-C30 saturated organic group, and a substituted or unsubstituted C1-C30 unsaturated organic group.

The $C_1$-$C_{30}$ saturated organic group and the $C_1$-$C_{30}$ unsaturated organic group may have a photosensitive functional group. Examples of the photosensitive functional group include an epoxy group, an amide group, an imide group, a urethane group, and an aldehyde group.

Examples of the $C_1$-$C_{30}$ saturated organic group and the $C_1$-$C_{30}$ unsaturated organic group include a substituted or unsubstituted $C_1$-$C_{30}$ alkyl group, a substituted or unsubstituted $C_1$-$C_{30}$ alkoxy group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, a substituted or unsubstituted $C_6$-$C_{30}$ aryloxy group, a substituted or unsubstituted $C_2$-$C_{30}$ heteroaryl group, a substituted or unsubstituted $C_2$-$C_{30}$ heteroaryloxy group, a substituted or unsubstituted $C_4$-$C_{30}$ carbocyclic group, a substituted or unsubstituted $C_4$-$C_{30}$ carbocyclic-oxy group, and a substituted or unsubstituted $C_2$-$C_{30}$ heterocyclic group.

In Formula 4, a binding site of R is not limited. Although only one R is shown in Formula 4 for convenience of description, R may be substituted at any site where substitution is possible.

A-L-A'  Formula 5 wherein, in Formula 5, each of A and A' may be identical to or different from each other and may independently be a monovalent organic group derived from one of the monomers represented by Formula 4 and L may be a linker which represents a single bond or is one of a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_7$-$C_{30}$ arylene-alkylene group, a substituted or unsubstituted $C_6$-$C_{30}$ arylene group, a substituted or unsubstituted $C_2$-$C_{30}$ heteroarylene group, a substituted or unsubstituted $C_2$-$C_{30}$ heteroarylene-alkylene group, a substituted or unsubstituted $C_1$-$C_{30}$ alkylene-oxy group, a substituted or unsubstituted $C_7$-$C_{30}$ arylene-alkylene-oxy group, a substituted or unsubstituted $C_6$-$C_{30}$ arylene-oxy group, a substituted or unsubstituted $C_2$-$C_{30}$ heteroarylene-oxy group, a substituted or unsubstituted $C_3$-$C_{30}$ heteroarylene-alkylene-oxy group, —C(=O)—, and —SO$_2$—.

In L, the substituted $C_1$-$C_{30}$ alkylene group, the substituted $C_2$-$C_{30}$ alkenylene group, the substituted $C_2$-$C_{30}$ alkynylene group, the substituted $C_7$-$C_{30}$ arylene-alkylene group, the substituted $C_6$-$C_{30}$ arylene group, the substituted $C_2$-$C_{30}$ heteroarylene group, the substituted $C_3$-$C_{30}$ heteroarylene-alkylene group, the substituted $C_1$-$C_{30}$ alkylene-oxy group, the substituted $C_7$-$C_{30}$ arylene-alkylene-oxy group, the substituted $C_6$-$C_{30}$ arylene-oxy group, the substituted $C_2$-$C_{30}$ heteroarylene-oxy group, and the substituted $C_3$-$C_{30}$ heteroarylene-alkylene-oxy group may be substituted with at least one substituent selected from a halogen atom, a hydroxyl group, an isocyanate group, a glycidyloxy group, a carboxyl group, an aldehyde group, an amino group, a siloxane group, an epoxy group, an imino group, a urethane group, an ester group, an epoxy group, an amide group, an imide group, an acryl group, and a methacryl group, or may be substituted with a photosensitive functional group.

The first material may be at least one of a compound represented by Formula 7 and a compound represented by Formula 8:

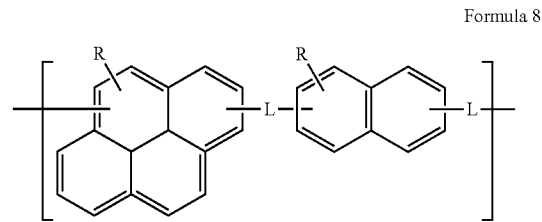

Formula 7

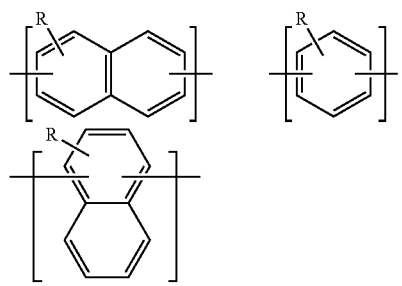

wherein, in Formula 7, R is the same as described with reference to Formula 4.

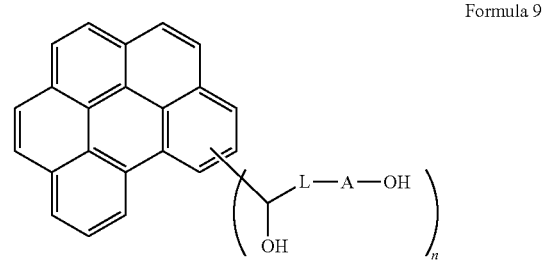

Formula 8 wherein, in Formula 8, R is the same as described with reference to Formula 4, and L is the same as described with reference to Formula 5.

In Formulae 7 and 8, a binding site of R is not limited. Although only one R is included in Formulae 7 and 8 for convenience of description, R may be substituted at any site where substitution is possible.

A weight average molecular weight of the polymer containing a repeating unit including a monomer containing an aromatic ring may be about 300 to about 30,000. When a polymer having a weight average molecular weight within this range is used, a thin film may be more easily formed, and a transparent hardmask may be manufactured.

In one or more example embodiments, the first material may be a compound represented by Formula 9:

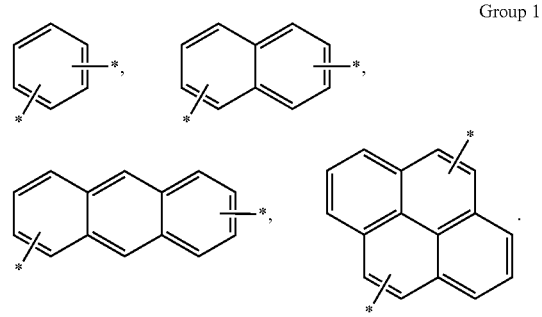

Formula 9 wherein, in Formula 9, A may be a substituted or unsubstituted $C_6$-$C_{30}$ arylene group, L may be a single bond or a substituted or unsubstituted $C_1$-$C_6$ alkylene group, and n may be an integer from 1 to 5.

The arylene group may be selected from groups of Group 1:

Group 1

In some embodiments, the compound of Formula 9 may be represented by Formulae 9a to 9c:

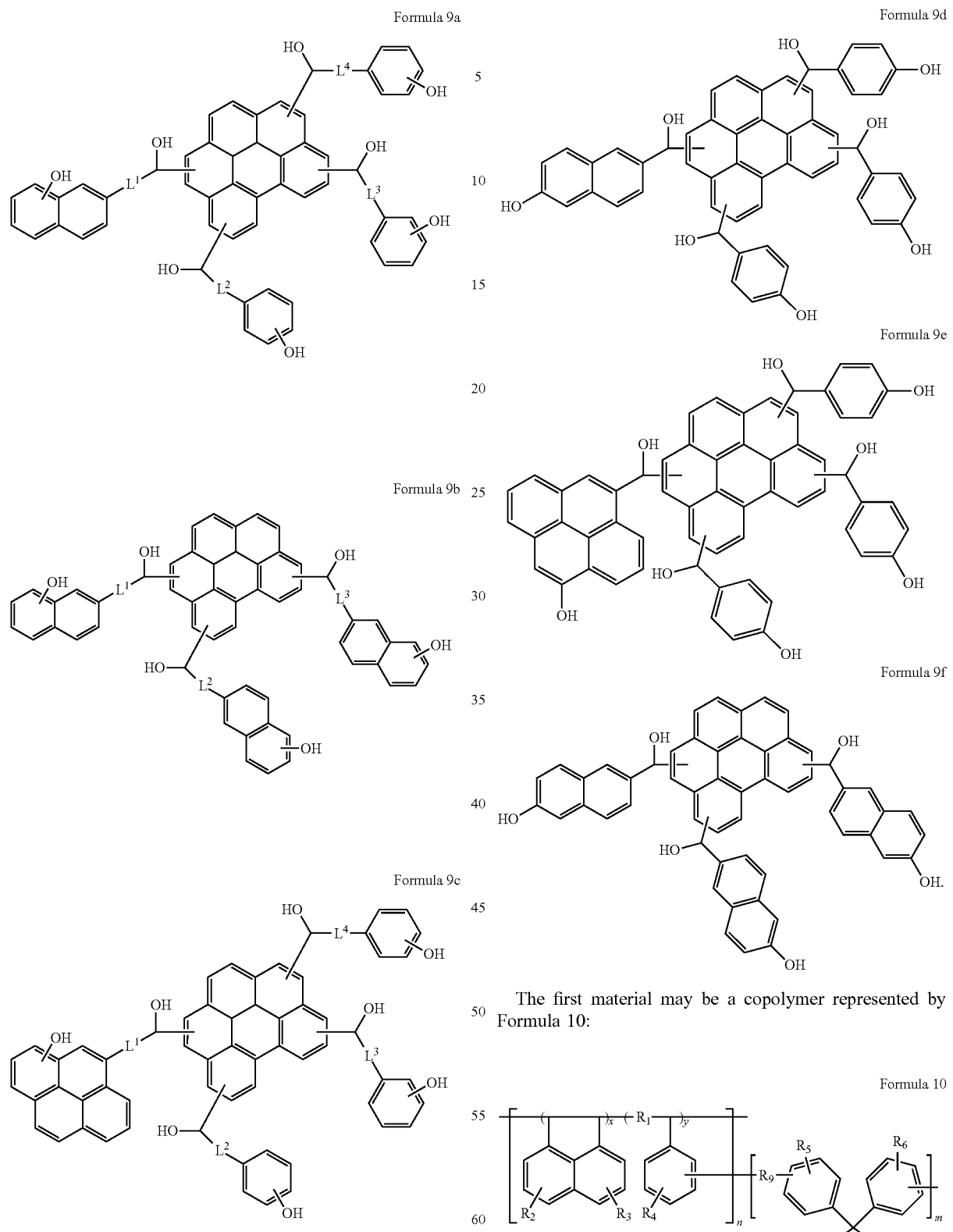
wherein, in Formulae 9a, 9b, and 9c, each of $L^1$ to $L^4$ may independently be a single bond or a substituted or unsubstituted $C_1$-$C_6$ alkylene group.
The first material may be selected from compounds represented by Formulae 9d to 9f:
The first material may be a copolymer represented by Formula 10:

wherein, in Formula 10, $R_1$ may be a $C_1$-$C_4$ substituted or unsubstituted alkylene; $R_2$, $R_3$, $R_7$, and $R_8$ may each independently be hydrogen, a hydroxy group, a $C_1$-$C_{10}$ linear or branched cycloalkyl group, an $C_1$-$C_{10}$ alkoxy group, a $C_6$-$C_{30}$ aryl group, or a mixture thereof; $R_4$, $R_5$, and $R_6$ may each independently be hydrogen, a hydroxy group, a $C_1$-$C_4$ alkoxy group, an alkylphenylalkyleneoxy group, or a mixture thereof; and $R_9$ may be an alkylene group, an alkylenephenylenealkylene group, a hydroxyphenylalkylene group, or a mixture thereof, wherein x and y may each independently be a mole fraction of two repeating units in part A which is about 0 to about 1, where x+y=1; n may be an integer from 1 to 200; and m may be an integer from 1 to 200.

The first material may be represented by Formula 10a, 10b or 10c:

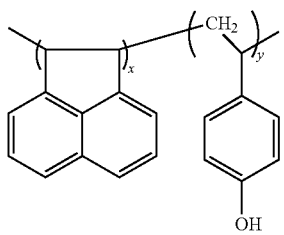

Formula 10a wherein, in Formula 10a, x may be 0.2, and y may be 0.8;

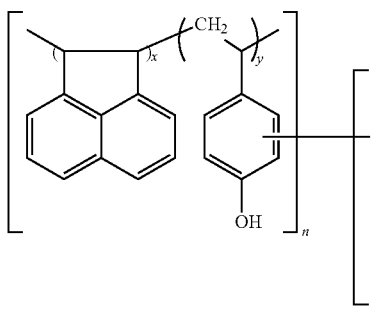

Formula 10b wherein, in Formula 10b, x may be 0.2, y may be 0.8, n=90, and m=10; and

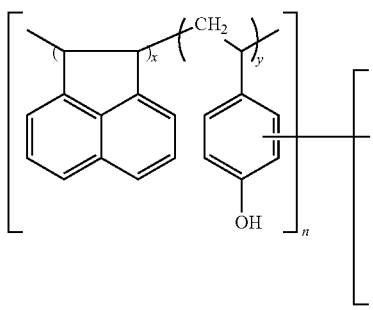

Formula 10c wherein, in Formula 10c, x may be 0.2, y may be 0.8, n=90, and m=10.

The first material may be a copolymer represented by Formula 11 or 12:

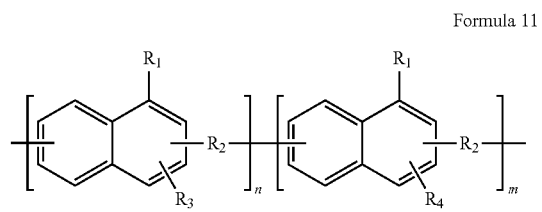

Formula 11

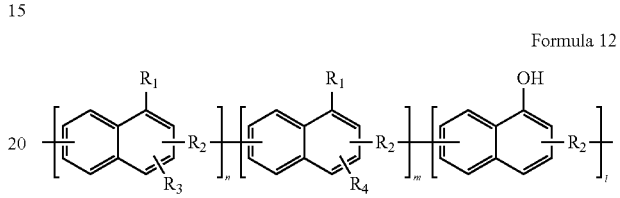

Formula 12 wherein, in Formulae 11 and 12, m and n may each be an integer from 1 to 190, $R_1$ may be one of hydrogen (—H), a hydroxy group(—OH), a $C_1$-$C_{10}$ alkyl group, a $C_6$-$C_{10}$ aryl group, an allyl group, and a halogen atom, $R_2$ may be one of a group represented by Formula 9A, a phenyl group, a chrysene group, a pyrene group, a fluoroanthene group, an anthrone group, a benzophenone group, a thioxanthone group, an anthracene group, and their derivatives; $R_3$ may be a conjugated diene; and $R_4$ may be an unsaturated dienophile.

Formula 9A

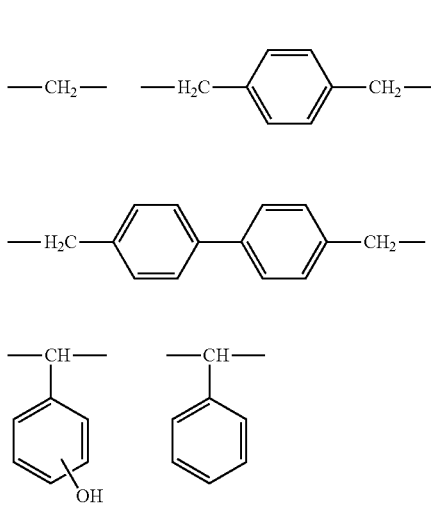

wherein, in Formulae 11 and 12, $R_3$ may be a 1,3-butadienyl group, or a 1,6-cyclopentadienylmethyl group, and $R_4$ may be a vinyl group or a cyclopentenylmethyl group.

The first material may be a polymer represented by one of Formulae 13 to 16.

Formula 13

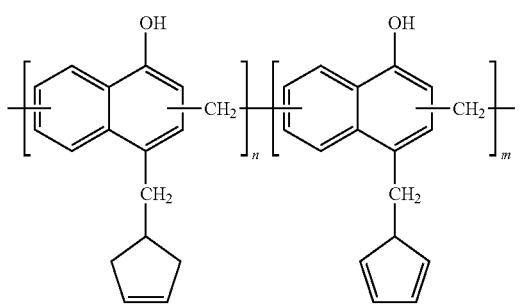

wherein, in Formula 13, m+n=21, a weight average molecular weight thereof may be about 10,000 g/mol, and a polydispersity thereof may be 2.1;

Formula 14

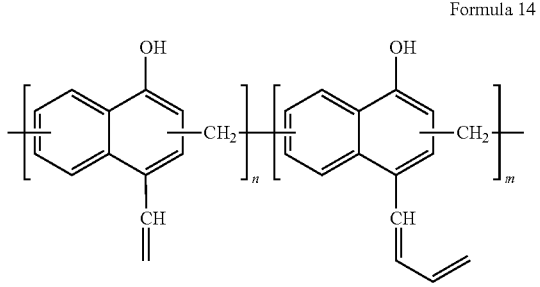

wherein, in Formula 14, a weight average molecular weight thereof may be about 11,000 g/mol, and a polydispersity thereof may be 2.1;

Formula 15

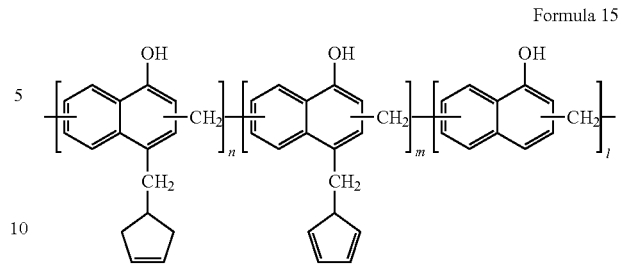

wherein, in Formula 15, a weight average molecular weight thereof may be about 10,000 g/mol, a polydispersity thereof may be 1.9, l+m+n=21, and n+m:l=2:1; and Formula 16

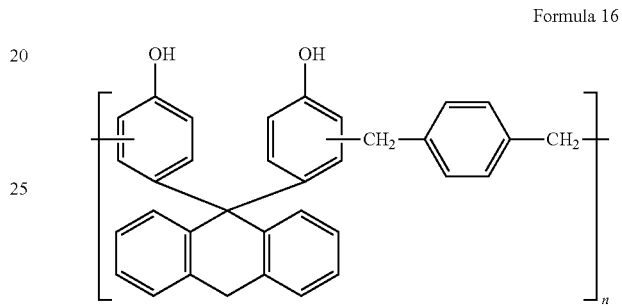

wherein, in Formula 16, a weight average molecular weight thereof may be about 10,000 g/mol, a polydispersity thereof may be about 2.0, and n may be about 20.

The GNP has a relatively low reactivity with respect to a $C_xF_y$ gas, which is an etching gas used to perform etching on a material layer such as $SiO_2$ or SiN, and thus etching resistance of the GNP may increase. When an etching gas with a relatively low reactivity with respect to $SiO_2$ or $SiN_x$, such as $SF_6$ or $XeF_6$, is used, etching may be more easily performed on the GNP, and thus ashing may be more easily performed thereon as well. Moreover, the 2D layered nanostructure is a transparent material having a band gap, and thus the preparation process may be more easily carried out because an additional align mask may not be necessary.

The hexagonal boron nitride derivative is a hexagonal boron nitride (h-BN) or a hexagonal boron carbonitride (h-BxCyNz) (wherein the sum of x, y, and z may be 3). In the hexagonal boron nitride derivative, boron and nitrogen atoms may be regularly included in a hexagonal ring, or some of boron and nitrogen atoms may be substituted with carbon atoms while maintaining the hexagonal ring.

The metal chalcogenide-based material is a compound including at least one Group 16 (chalcogenide) element and at least one electropositive element. For example, the metal chalcogenide-based material may include one or more metal elements selected from molybdenum (Mo), tungsten (W), niobium (Nb), vanadium (V), tantalum (Ta), titanium (Ti), zirconium (Zr), hafnium (Hf), technetium (Tc), rhenium (Re), copper (Cu), gallium (Ga), indium (In), tin (Sn), germanium (Ge), and lead (Pb) and one chalcogen element selected from sulfur (S), selenium (Se), and tellurium (Te).

The metal chalcogenide-based material may be selected from molybdenum sulfide ($MoS_2$), molybdenum selenide ($MoSe_2$), molybdenum telluride ($MoTe_2$), tungsten sulfide ($WS_2$), tungsten selenide ($WSe_2$), and tungsten telluride (WTe$_2$). In some embodiments, the metal chalcogenide-based material may be molybdenum sulfide (MoS$_2$).

The hexagonal boron nitride has a flat hexagonal crystal structure, the vertices of which are occupied alternatively by boron and nitrogen atoms. A layered structure of the hexagonal boron nitride is a structure in which a boron atom and a nitrogen atom neighboring each other overlap due to their polarities, and this structure is also referred as "an AB stacking". The hexagonal boron nitride may have a layered structure in which nanolevel-thin sheets are stacked in layers, and these layers may be separated or detached from each other to form a single layer or multiple layers of a hexagonal boron nitride sheet.

The hexagonal boron nitride according to one or more example embodiments may have a peak observed at about 1360 cm$^{-1}$ in Raman spectroscopy analysis.

This location of the peak may reveal the number of layers in the hexagonal boron nitride. Through atomic force microscopic (AFM) analysis, Raman spectroscopy analysis, and transmission electron microscope (TEM) analysis performed on the hexagonal boron nitride, it may be found that the hexagonal boron nitride has a nanosheet structure.

X-ray diffraction analysis using CuKα is performed on the hexagonal boron nitride, and as a result of the X-ray diffraction analysis, the hexagonal boron nitride may include a 2D layered structure having a (002) crystal face peak. The (002) crystal face peak may be observed within a range of about 20° to about 27°.

An interlayer distance (d-spacing) of the hexagonal boron nitride obtained from the X-ray diffraction analysis may be in a range of about 0.3 nm to about 0.7 nm, for example, about 0.334 nm to about 0.478 nm. An average particle diameter of the hexagonal boron nitride crystals obtained from the X-ray diffraction analysis may be about 1 nm or greater, for example, in a range of about 23.7 Angstroms (Å) to about 43.9 Å. When the interlayer distance (d-spacing) is within this range, the hardmask composition may have desirable etching resistance.

The hexagonal boron nitride may be formed as a single layer of 2D boron nitride, or formed by stacking multiple layers of 2D boron nitride.

Hereinafter, a method of preparing a hardmask using the hardmask composition according to one or more example embodiments will further be described.

A hardmask composition according to one or more example embodiments may include a derivative mixture including a derivative of a 2D carbon nanostructure, a derivative of a 0D carbon nanostructure, and a solvent. In some embodiments, the hardmask composition may include a composite including a 2D carbon nanostructure and a 0D carbon nanostructure; and a solvent. When the hardmask composition includes a derivative of a 2D carbon nanostructure, a derivative of a 0D carbon nanostructure, and a solvent, a derivative mixture (or composite) including the derivative of the 2D carbon nanostructure and the derivative of the 0D carbon nanostructure may be formed in-situ when forming a pattern using the hardmask composition.

An etching layer may be coated with the hardmask composition and dried to form a hardmask.

Examples of the derivative of the 2D carbon nanostructure include a COOH-functionalized GNP and a GNP precursor. Examples of the derivative of the 0D carbon nanostructure include a OH-functionalized fullerene.

During or after the coating the etching layer with the hardmask composition, heat treatment may be performed on the hardmask composition. Conditions for the heat treatment may vary depending on a material for the etching layer, but a temperature of the heat treatment may be from room temperature (about 20° C. to about 25° C.) to about 1,500° C.

The heat treatment may be performed in an inert gas atmosphere or in vacuum.

A heating source of the heat treatment may be induction heating, radiant heat, lasers, infrared rays, microwaves, plasma, ultraviolet rays, or surface plasmon heating.

The inert gas atmosphere may be prepared by mixing a nitrogen gas and/or an argon gas.

After the heat treatment, the solvent may be removed. Subsequently, c-axis arrangement of graphene may be performed. The resultant from which the solvent is removed may be baked at a temperature of about 400° C. or lower, for example, about 100° C. to about 400° C. Then, another heat treatment may be further performed on the baked resultant at a temperature of about 800° C. or lower, for example, in a range of about 400° C. to about 800° C.

A thermal reduction process may proceed during the heat treatment. When the GNP undergoes the thermal reduction process, a content of oxygen in the GNP may decrease.

In some embodiments, the baking process may not be performed, and the heat treatment may only be performed.

When the temperatures of the heat treatment and the baking process are within any of these ranges, the prepared hardmask may have desirable etching resistance.

A temperature increasing rate in the heat treatment and the baking process may be about 1° C./min to about 1,000° C./min. When a temperature increasing rate is within this range, the deposited layer may not be damaged due to a rapid temperature change, and thus process efficiency may be desirable.

A thickness of the hardmask may be in a range of about 10 nm to about 10,000 nm.

Hereinafter, a method of preparing a GNP that may be used as a 2D carbon nanostructure will further be described.

In a first preparation method, an interlayer insertion material may be intercalated into graphite to prepare a graphite intercalation compound (GIC), and a GNP may be obtained therefrom.

The interlayer insertion material may be, for example, potassium sodium tartrate. When potassium sodium tartrate is used as the interlayer insertion material, the material may intercalate into graphite without an additional surfactant or a solvent during a solvo-thermal reaction to prepare a GIC, and then desired GNPs may be obtained by selecting particles according to a particle size of the resultant. Potassium sodium tartrate may serve as an interlayer insertion material and as a solvent at the same time.

The solvo-thermal reaction may be performed in, for example, an autoclave. The solvo-thermal reaction may be performed at a temperature, for example, in a range of about 25° C. to about 400° C., or in some embodiments, at about 250° C.

Examples of graphite as a starting material include natural graphite, kish graphite, synthetic graphite, expandable graphite or expanded graphite, or a mixture thereof.

A third preparation method may be a method of preparing a GNP to which a functional group is attached. The functional group may be, for example, a hydroxyl group. A GNP to which a hydroxyl group is attached may be highly soluble in a solvent, and thus may be utilized in various applications.

A GNP to which a hydroxyl group is attached according to one or more example embodiments may be prepared as follows.

A hydrothermal fusion reaction may be performed on a polycyclic aromatic hydrocarbon under an alkali aqueous solution condition, which may result in a GNP having a single crystal.

A hydrothermal reaction under the alkali aqueous solution condition may be performed at a temperature in a range of about 90° C. to about 200° C. In the hydrothermal reaction, when alkaline species, e.g., OH$^-$, are present, hydrogen removal, condensation, or graphitization, and edge functionalization may occur.

Examples of the polycyclic aromatic hydrocarbon may include a pyrene and a 1-nitropyrene.

Before performing the hydrothermal reaction, a nitration reaction may be performed on the polycyclic aromatic hydrocarbon. The nitration reaction may be performed using a hot nitrate salt or hot nitric acid (e.g., hot $HNO_3$).

During the hydrothermal reaction, an amine-based material, e.g., $NH_3$, $NH_2NH_2$, may be added. When such an amine-based material is added thereto, water-soluble OH$^-$ and an amine-functionalized GNP may be obtained.

According to a second preparation method, a GNP may be obtained by acid-treating graphite. For example, an acid and an oxidizing agent may be added to graphite, heated and allowed to react, and cooled to room temperature (25° C.) to obtain a mixture containing a GNP precursor. An oxidizing agent may be added to the mixture containing the precursor to undergo an oxidizing process, and the resultant may be worked up to prepare a desired GNP.

Examples of the acid include sulfuric acid, nitric acid, acetic acid, phosphoric acid, hydrofluoric acid, perchloric acid, trifluoroacetic acid, hydrochloric acid, m-chlorobenzoic acid, and a mixture thereof. Examples of the oxidizing agent include, potassium permanganate, potassium perchlorate, ammonium persulfate, and a mixture thereof. Examples of the acid and the oxidizing agent are as described above. An amount of the oxidizing agent may be in a range of about 0.00001 parts to about 30 parts by weight based on 100 parts by weight of graphite.

The reaction may proceed by adding the acid and the oxidizing agent to graphite and heating the resultant using, for example, microwave. The microwave may have an output in a range of about 50 Watts (W) to about 1,500 W and a frequency in a range of about 2.45 gigahertz (GHz) to about 60 GHz. Time for applying the microwave may vary depending on the frequency of the microwave, but the microwave may be applied for about 10 minutes to about 30 minutes.

The work-up process may include controlling the resultant underwent the oxidizing process to room temperature, adding deionized water to dilute the resultant, and adding a base thereto to neutralize the resultant.

The work-up process may also include a process of selecting particles from the resultant according to a particle size to obtain desired GNPs.

Hereinafter, a method of forming a pattern using a hardmask composition according to one or more example embodiments will be described by referring to FIGS. 2A to 2E.

Figure 2A:
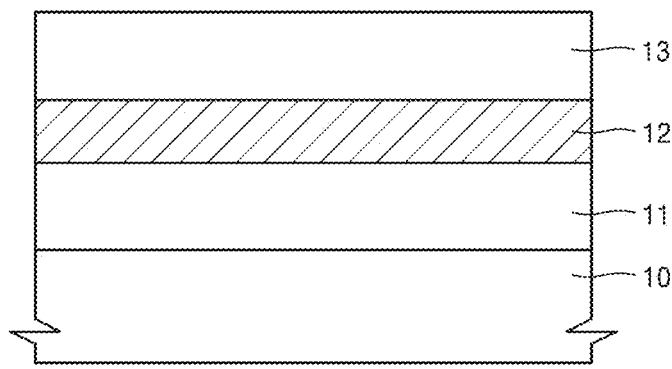
FIGS. 2A to 2E illustrate a method of forming a pattern using a hardmask composition according to one or more example embodiments.

Referring to FIG. 2A, an etching layer 11 may be formed on a substrate 10. A hardmask composition according to one or more example embodiments may be provided on the etching layer 11 to form a hardmask 12.

A process of providing the hardmask composition may include at one of spin coating, air spraying, electrospraying, dip coating, spray coating, doctor blade coating, and bar coating.

In some embodiments, the hardmask composition may be provided using a spin-on coating method. The hardmask composition may coat the substrate 10 at a thickness of, for example, in a range of about 10 nm to about 10,000 nm, and in some embodiments, about 10 nm to about 1,000 nm, but the thickness of the hard composition is not limited thereto.

The substrate 10 is not particularly limited. For example, the substrate 10 may be at least one selected from a Si substrate; a glass substrate; a GaN substrate; a silica substrate; a substrate including at least one selected from nickel (Ni), cobalt (Co), iron (Fe), platinum (Pt), palladium (Pd), gold (Au), aluminum (Al), chromium (Cr), copper (Cu), manganese (Mn), molybdenum (Mo), rhodium (Rh), iridium (Ir), tantalum (Ta), titanium (Ti), tungsten (W), uranium (U), vanadium (V), and zirconium (Zr); and a polymer substrate.

A photoresist layer 13 may be formed on the hardmask 12.

Figure 2B:
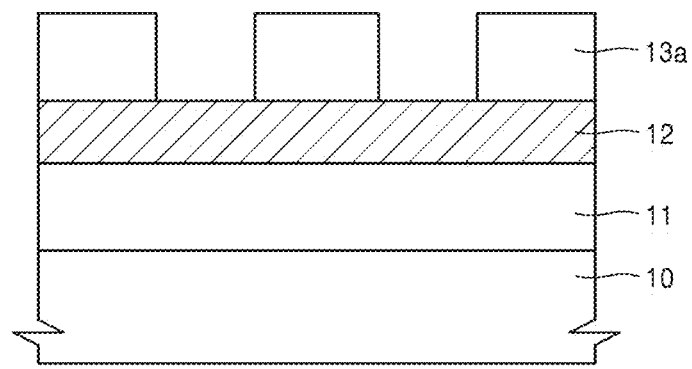

As shown in FIG. 2B, a photoresist pattern 13a may be formed by exposing and developing the photoresist layer 13 using a known method.

The process of exposing the photoresist layer 13 may be performed using, for example, ArF, KrF, or extreme ultra violet (EUV). After the exposing process, heat treatment may be performed on the exposed photoresist layer 13 at a temperature in a range of about 200° C. to about 500° C.

In the developing process, a developing solution, e.g., an aqueous solution of tetramethylammonium hydroxide (TMAH), may be used.

Figure 2C:
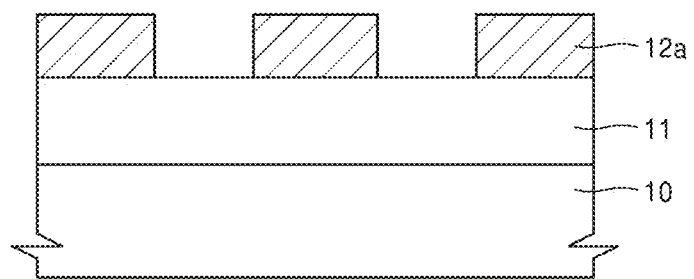

Subsequently, the hardmask 12 may be etched using the photoresist pattern 13a as an etching mask to form a hardmask pattern 12a on the etching layer 11 (FIG. 2C).

A thickness of the hardmask pattern 12a may be in a range of about 10 nm to about 10,000 nm. When the thickness of the hardmask pattern 12a is within this range, the layer may have desirable etching resistance as well as desirable homogeneousness.

For example, the etching process may be performed using a dry etching method using an etching gas. Examples of the etching gas include at least one selected from $CF_4$, $CHF_3$, $C_2F_6$, $C_4F_8$, $CHF_3$, $Cl_2$, and $BCl_3$.

In some embodiments, when a mixture gas of $C_4F_8$ and $CHF_3$ is used as an etching gas, $C_4F_8$ may be mixed with $CHF_3$ at a volume ratio in a range of about 1:10 to about 10:1.

The etching layer 11 may be formed as a plurality of patterns. The plurality of patterns may vary, for example, may be a metal pattern, a semiconductor pattern, and an insulator pattern. For example, the plurality of patterns may be various patterns applied to a semiconductor integrated circuit device.

The etching layer 11 may contain a material that is to be finally patterned. The material of the etching layer 11 may be, for example, a metal (e.g., aluminum or copper), a semiconductor (e.g., silicon), or an insulator (e.g., silicon oxide or silicon nitride). The etching layer 11 may be formed using various methods (e.g., sputtering, electronic beam deposition, chemical vapor deposition, and physical vapor deposition). For example, the etching layer 11 may be formed using a chemical vapor deposition method.

Figure 2D:
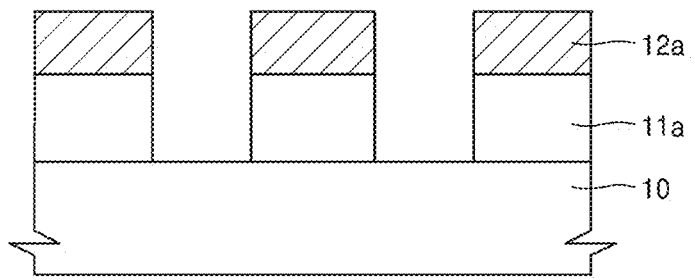
Figure 2E:
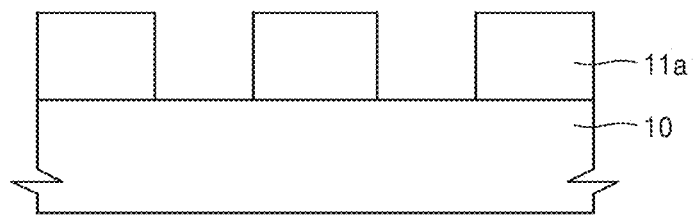

As shown in FIGS. 2D and 2E, the etching layer 11 may be etched using the hardmask pattern 12a as an etching mask to later form an etching layer pattern 11a having a desired fine pattern.

When the hardmask composition according to one or more example embodiments is used, a solution process may be available, coating equipment may not be necessary, ashing-off may be easily performed in an oxygen atmosphere, and mechanical properties may be excellent.

The hardmask according to one or more example embodiments may be a structure in which a 2D carbon nanostructure and a 0D carbon nanostructure are stacked.

The hardmask according to one or more example embodiments may be inserted between other layers so as to use the hardmask as a stopper in the manufacture of a semiconductor device.

Figure 2F:
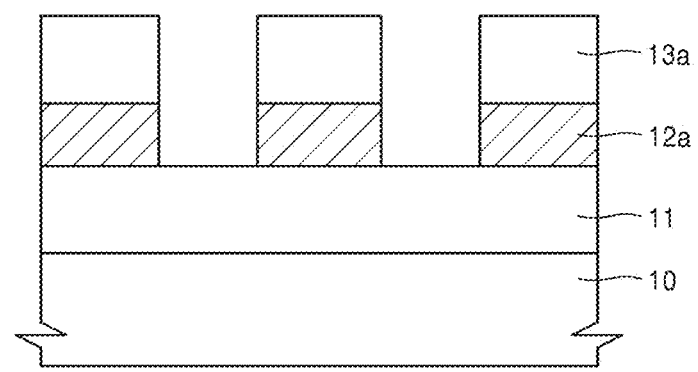
FIG. 2F illustrates a part of a method of forming a pattern using a hardmask composition according to one or more example embodiments.

FIG. 2F illustrates a part of a method of forming a pattern using a composition according to one or more example embodiments.

Referring to FIG. 2F, as previously-described with reference to FIG. 2A, an etching layer 11 may be formed on a substrate 10 and a hardmask 12 and a photoresist layer 13 may be formed on the etching layer 11. Then, as previously-described with reference to FIG. 2B, a photoresist pattern 13a may be formed on the hardmask 12. Thereafter, the hardmask 12 may be etched using the photoresist pattern 13a as an etching mask to form a hardmask pattern 12a on the etching layer 11. As shown in FIG. 2F, a portion of the photoresist pattern 13a may remain after the hardmask pattern 12a is formed.

Then, the etching layer 11 may be etched to form an etched layer pattern 11a having a desired fine pattern using a remaining portion of the photoresist pattern 13a and the hardmask pattern 12a as an etching mask. Afterwards, the hardmask pattern 12a and any residual portion of photoresist pattern 13a may be removed using $O_2$ ashing and/or wet stripping to form a structure including the etched layer pattern 11a on the substrate 10 (see FIG. 2E). For example, the wet stripping may be performed by using alcohol, acetone, or a mixture of nitric acid and sulfuric acid.

Hereinafter, a method of forming a pattern using a hardmask composition according to one or more example embodiments will be described by referring to FIGS. 3A to 3D.

Figure 3A:
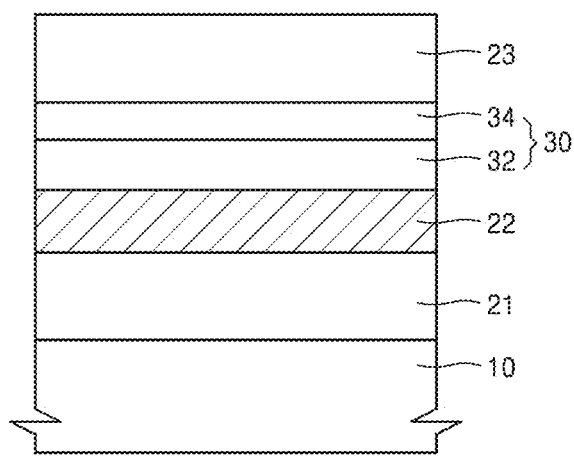
FIGS. 3A to 3D illustrate a method of forming a pattern using a hardmask composition according to one or more example embodiments.

Referring to FIG. 3A, an etching layer 21 may be formed on a substrate 20. The substrate 20 may be a silicon substrate, but is not limited thereto.

The etching layer 21 may be formed as, for example, a silicon oxide layer, a silicon nitride layer, a silicon nitroxide layer, a silicon carbide (SiC) layer, or a derivative layer thereof. Then, a hardmask composition according to one or more example embodiments may be provided on the etching layer 21 to form a hardmask 22.

Figure 3B:
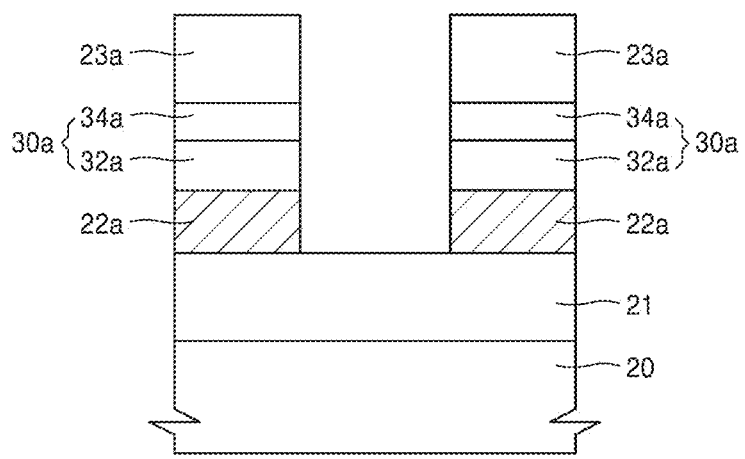
Figure 3C:
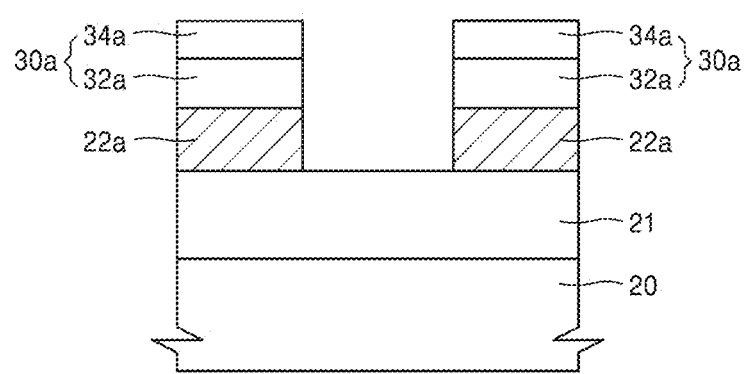

An anti-reflection layer 30 may be formed on the hardmask 22. The anti-reflection layer 30 may include an inorganic anti-reflection layer, an organic anti-reflection layer, or a combination thereof. FIGS. 3A to 3C illustrate embodiments in which the anti-reflection layer 30 includes an inorganic anti-reflection layer 32 and an organic anti-reflection layer 34.

The inorganic anti-reflection layer 32 may be, for example, a SiON layer, and the organic anti-reflection layer 34 may be a polymer layer commonly used in the art having an appropriate refraction index and a relatively high absorption coefficient on a photoresist with respect to a wavelength of light.

A thickness of the anti-reflection layer 30 may be, for example, in a range of about 100 nm to about 500 nm.

A photoresist layer 23 may be formed on the anti-reflection layer 30.

A photoresist pattern 23a may be formed by exposing and developing the photoresist layer 23 using a known method. Subsequently, the anti-reflection layer 30 and the hardmask 22 may be sequentially etched using the photoresist pattern 23a as an etching mask to form an anti-reflection pattern 30a and a hardmask pattern 22a on the etching layer 21. The anti-reflection pattern 30a may include an inorganic anti-reflection pattern 32a and an organic anti-reflection pattern 34a.

FIG. 3B illustrates that the photoresist pattern 23a and an anti-reflection pattern 30a remain after forming the hardmask pattern 22a. However, in some cases, part of or the whole photoresist pattern 23a and the anti-reflection pattern 30a may be removed during an etching process for forming the hardmask pattern 22a.

In FIG. 3C, only the photoresist pattern 23a is removed.

Figure 3D:
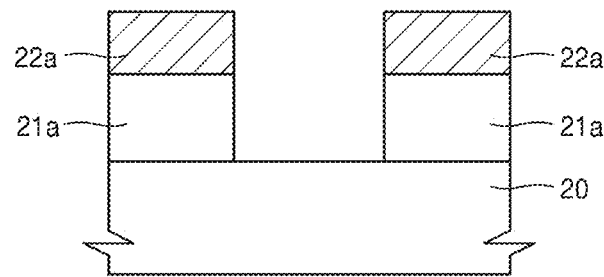

The etching layer 21 may be etched using the hardmask pattern 22a as an etching mask to form a desired etching layer pattern 21a (see FIG. 3D).

As described above, the hardmask pattern 22a is removed after forming the etching layer pattern 21a. In the preparation of the hardmask pattern 22a according to one or more example embodiments, the hardmask pattern 22a may be more easily removed using a known method, and little residue may remain after removing the hardmask pattern 22a.

The removing process of the hardmask pattern 22a may be performed by, but not limited to, $O_2$ ashing and wet stripping. For example, the wet stripping may be performed using alcohol, acetone, or a mixture of nitric acid and sulfuric acid.

A GNP in the hardmask prepared as above may have an amount of $sp^2$ carbon structures higher than the amount of $sp^3$ carbon structures. Thus, the hardmask may secure sufficient resistance to dry etching. In addition, such a hardmask may have desirable transparent properties, and thus an align mask for patterning may be more easily sensed.

FIGS. 4A to 4D illustrate a method of forming a pattern using a hardmask composition according to one or more example embodiments.

Figure 4A:
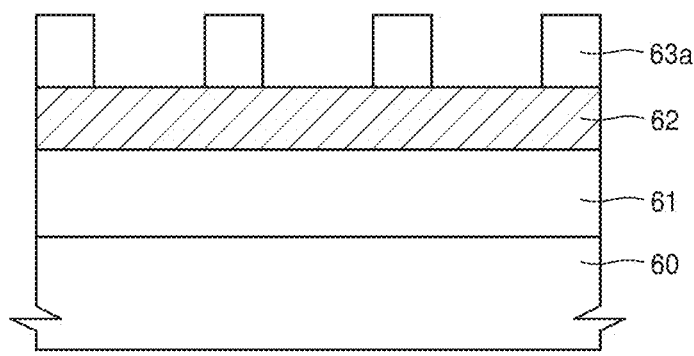
FIGS. 4A to 4D illustrate a method of forming a pattern using a hardmask composition according to one or more example embodiments.

Referring to FIG. 4A, an etching layer 61 may be formed on a substrate 60. Then, a hardmask 62 may be formed on the etching layer 61 and a first photoresist pattern 63a may be formed on the hardmask 62.

A material of the substrate 60 is not particularly limited, and the substrate 60 may be at least one of a Si substrate; a glass substrate; a GaN substrate; a silica substrate; a substrate including at least one of nickel (Ni), cobalt (Co), iron (Fe), platinum (Pt), palladium (Pd), gold (Au), aluminum (Al), chromium (Cr), copper (Cu), manganese (Mn), molybdenum (Mo), rhodium (Rh), iridium (Ir), tantalum (Ta), titanium (Ti), tungsten (W), uranium (U), vanadium (V), and zirconium (Zr); and a polymer substrate. The substrate 60 may be semiconductor-on-insulator (SOI) substrate such as a silicon-on-insulator substrate.

The etching layer 61 may be formed as, for example, a silicon oxide layer, a silicon nitride layer, a silicon nitroxide layer, a silicon oxynitride (SiON) layer, a silicon carbide (SiC) layer, or a derivative thereof. However, example embodiments are not limited thereto.

Thereafter, a hardmask composition according to one or more example embodiments may be provided on the etching layer 61 to form a hardmask 62.

Figure 4B:
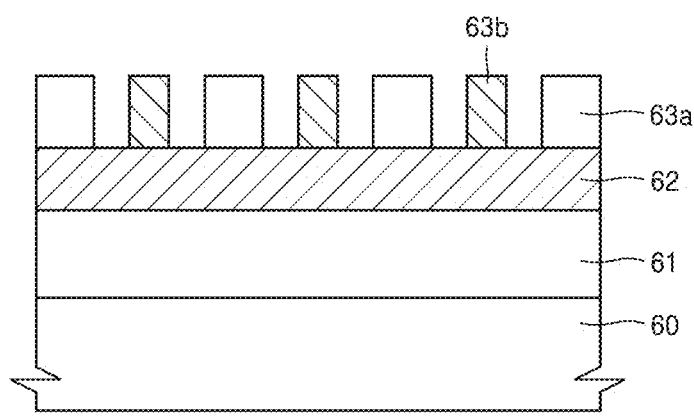

Thereafter, as shown in FIG. 4B, a second photoresist pattern 63b may be formed on top of the hardmask 62. The first and second photoresist patterns 63a and 63b may be alternately arranged.

Figure 4C:
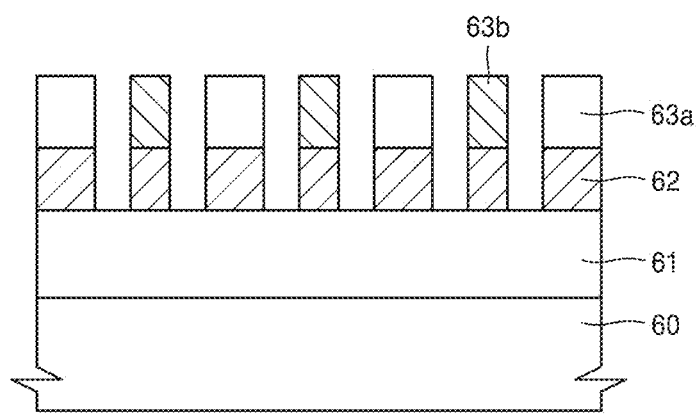

In FIG. 4C, the hardmask layer 62 may be etched using the first and second photoresist patterns 63a and 63b as an etch mask to form a hardmask pattern 62a. Then, in FIG. 4D, the etching layer 61 may be etched to form an etching layer pattern 61a.

Figure 4D:
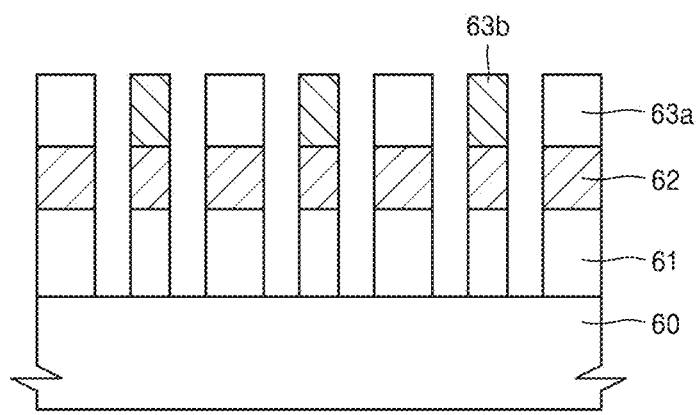

Even though FIGS. 4C and 4D illustrate the first and second photoresist patterns 63a and 63b remain on top of the hardmask pattern 62a after forming the hardmask pattern 62a, example embodiments are not limited thereto. A portion and/or an entire portion of the first and second photoresist patterns 63a and 63b may be removed during (and/or after) the process of forming the hardmask pattern 62a and/or the etching layer pattern 61a in FIGS. 4C and 4D.

FIGS. 5A to 5D illustrate a method of forming a pattern using a hardmask composition according to one or more example embodiments.

Figure 5A:
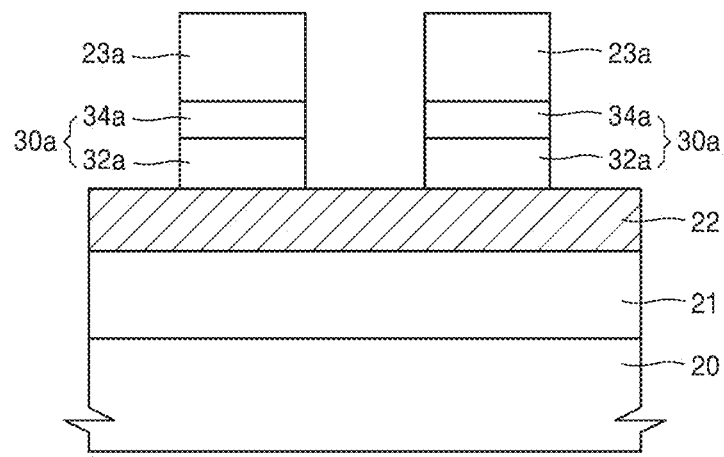
FIGS. 5A to 5D illustrate a method of forming a pattern using a hardmask composition according to one or more example embodiments.

Referring to FIG. 5A, as previously described with reference to FIG. 3A, a stacked structure including the substrate 20, etching layer 21, hardmask layer 22, anti-reflection layer 30, and photoresist layer 23 may be formed.

Thereafter, the photoresist layer may be exposed and developed to form a photoresist pattern 23a. The anti-reflection layer 30 may be etched by using the photoresist pattern 23a as an etching mask to form an anti-reflection layer pattern 30a on the etching layer 21. The anti-reflection layer pattern 30a may include an inorganic anti-reflection layer pattern 32a and an organic anti-reflection layer pattern 34a.

Figure 5B:
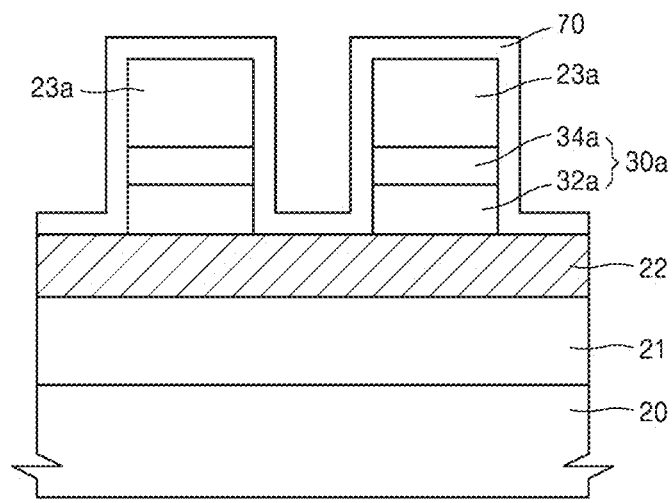

As shown in FIG. 5B, a dielectric layer 70 (e.g., silicon oxide) may be coated on the photoresist pattern 23a.

Figure 5C:
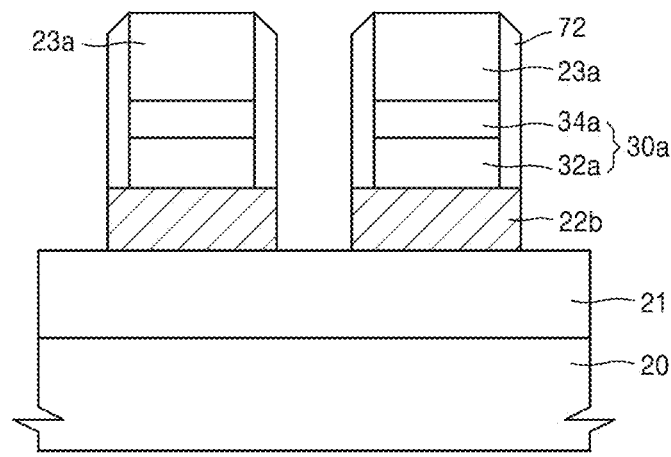

Referring to FIG. 5C, spacers 72 may be formed by etching the dielectric layer 70. A hardmask pattern 22b may be formed by etching the hard mask layer 22 using the photoresist pattern 23a and spacers 72 as an etch mask.

Figure 5D:
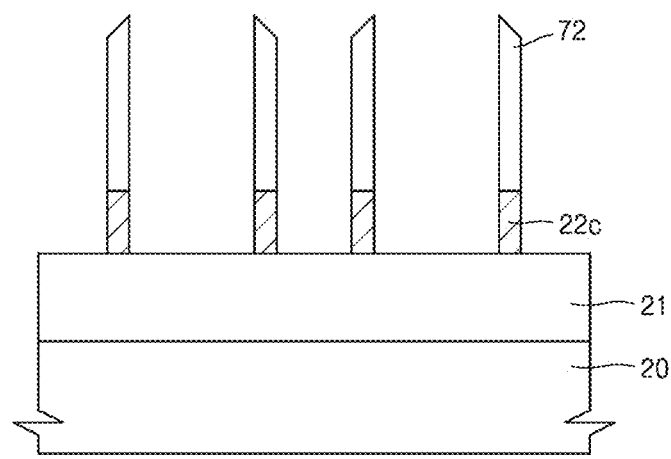

Referring to FIG. 5D, the photoresist pattern 23a and anti-reflection layer pattern 30a may be removed using the spacers 72 as an etch mask. Next, a second hardmask pattern 22c may be formed by etching the hardmask pattern 22b using the spacers as an etch mask.

Thereafter, the etching layer 21 may be etched to form a pattern corresponding to the second hardmask pattern 22c using the spacers 72 and the second hardmask pattern 22c as an etch mask. Additionally, the spacers 72 and second hardmask pattern 22c may be subsequently removed after patterning the etching layer 21.

According to one or more example embodiments, a pattern formed using a hardmask composition may be used in the manufacture and design of an integrated circuit device according to a preparation process of a semiconductor device. For example, the pattern may be used in the formation of a patterned material layer structure, e.g., metal lining, holes for contact or bias, insulation sections (for example, a Damascene Trench (DT) or shallow trench isolation (STI)), or a trench for a capacitor structure.

Hereinafter, one or more example embodiments will be described in detail with reference to the following examples. However, these examples are not intended to limit the scope of the one or more example embodiments.

Preparation Example 1: Preparation of Graphene Nanoparticle (GNP)

20 milligrams (mg) of graphite (available from Aldrich Co., Ltd.) and 100 mg of potassium sodium tartrate were added to an autoclave vessel, and the mixture was allowed to react at a temperature of 250° C. for about 60 minutes.

Once the reaction was complete, the resultant was centrifuged using a filter (8,000 nominal molecular weight limit (NMWL) and 10,000 NMWL, Amicon Ultra-15) to select a particle size, and this underwent dialysis to remove residues. Then the resultant was dried to obtain a spherical GNP having a particle diameter of about 10 nm.

Preparation Example 2: Preparation of GNP 20 mg of graphite (available from Alfa Aesar Co., Ltd.) was dissolved in 100 milliliters (mL) of concentrated sulfuric acid, and the mixture was sonicated for about 1 hour. 1 gram (g) of $KMnO_4$ was added thereto, and a temperature of the reaction mixture was adjusted to be about 25° C. or lower.

At atmospheric pressure, microwaves (power: about 600 W) were applied to the resultant while refluxing the resultant for 10 minutes. The reaction mixture was cooled so that a temperature of the reaction mixture was about 25° C., and then 700 mL of deionized water was added to the reaction mixture to dilute the reaction mixture. Next, a sodium hydroxide was added to the reaction mixture in an ice bath so that a pH of the reaction mixture was adjusted to about 7.

The reaction mixture was filtered through a porous membrane having a pore diameter of about 200 nm to separate and remove graphene having a large size. Residues was removed from the obtained filtrate by performing dialysis, and the resultant was dried to obtain a spherical GNP having an average particle diameter of about 5 nm.

Preparation Example 3: Preparation of GNP to which Hydroxyl Group (OH) is Bound 160 ml of nitric acid was added to 2 g of pyrene, and the mixture was refluxed at a temperature of about 80° C. for about 12 hours to obtain a reaction mixture containing 1,3,6-trinitropyrene. The reaction mixture was cooled to room temperature, and 1 L of deionized water were added thereto to dilute the reaction mixture. Subsequently, this mixture was filtered through a fine porous film having a pore diameter of about 0.22 μm.

1.0 g of 1,3,6-trinitropyrene obtained after the filtration was dispersed in 0.6 L of a 0.2 molar (M) NaOH aqueous solution, and ultrasonic waves (500 W, 40 kHz) were then applied thereto for about 2 hours to obtain a suspension. The obtained suspension was placed in an autoclave vessel and was allowed to react at a temperature of about 200° C. for about 10 hours. The resultant was cooled to room temperature, and filtered through a fine porous film having a pore diameter of about 0.22 μm to remove an insoluble carbon product. Dialysis was performed on the resultant thus obtained after the filtration for 2 hours to obtain a GNP to which an OH group was bound. The GNP having OH group had an average particle diameter of about 15 nm.

The GNPs prepared in Preparation Examples 1 and 3 had a structure in which a functional group containing oxygen was positioned at an edge thereof. The GNP prepared in Preparation Example 2 had a structure in which a functional group containing oxygen was positioned at an edge and on a plane thereof by using microwaves during the preparation process.

Preparation Example 4: Preparation of COOH-Functionalized GNP

Chloroacetic acid was added to the GNP to which an OH group is bound prepared in Preparation Example 3, followed by heat treatment at a temperature of 80° C. for 60 minutes. After the heat-treatment, a coupling reaction was performed to obtain a COOH-functionalized GNP. The GNP having COOH group had an average particle diameter of about 15 nm.

Preparation Example 5: Preparation of OH-Functionalized Fullerene (C60)

0.1 g of fullerene (C60) was ground in mortar, and 1 g of sodium hydroxide and 1 g of hydrogen peroxide ($H_2O_2$) was added thereto to obtain a mixture. The mixture was ground for 10 minutes to obtain OH-functionalized fullerene (C60).

Example 1: Preparation of Hardmask Composition

The OH-functionalized fullerene (C60) (particle size: about 0.7 nm) prepared in Preparation Example 5 and the COOH-functionalized GNP (particle size: about 7 nm to 8 nm) prepared in Preparation Example 4 were mixed together.

Dichlorobenzene was added thereto as a solvent, and the resulting mixture underwent heat treatment at a temperature of about 80° C. to thereby prepare a hardmask composition including a composite containing the OH-functionalized fullerene (C60) prepared in Preparation Example 5 and the COOH-functionalized GNP prepared in Preparation Example 4. In the hardmask composition, the OH-functionalized fullerene (C60) prepared in Preparation Example 5 was mixed with the COOH-functionalized GNP prepared in Preparation Example 4 at a weight ratio of 2:8. An amount of dichlorobenzene was 10 mL for 1 g of the OH-functionalized fullerene (C60) prepared in Preparation Example 5.

Example 2: Preparation of Hardmask Composition

The OH-functionalized fullerene (C60) prepared in Preparation Example 5 was mixed with a GNP precursor, e.g., pyrene. Water and sodium hydroxide (NaOH) were added thereto to obtain a mixture. The mixture was heat-treated at a temperature of about 250° C. for 5 hours to perform a hydrothermal reaction to obtain a hardmask composition. In the hardmask composition, the OH-functionalized fullerene (C60) prepared in Preparation Example 5 was mixed with the COOH-functionalized GNP prepared in Preparation Example 4 at a weight ratio of 2:8. In the hardmask composition, an amount of the water was 600 mL for 1 g of the OH-functionalized fullerene (C60) prepared in Preparation Example 5, and an amount of the sodium hydroxide was 12 g for 1 g of the OH-functionalized fullerene (C60) prepared in Preparation Example 5.

Example 3: Preparation of Silicon Substrate on which Silicon Oxide Pattern was Formed The hardmask composition prepared in Example 1 was spin coated on a silicon substrate on which a silicon oxide had been formed. Subsequently, baking was performed thereof at a temperature of 400° C. for 2 minutes, to form a hardmask having a thickness of about 200 nm and including the composite containing fullerene and GNP. The fullerene was mixed with the GNP at a weight ratio of 2:8.

The hardmask was coated with an ArF photoresist at a thickness of about 1,700 (Angstroms) A and then pre-baked at a temperature of about 110° C. for about 60 seconds. The resultant was then exposed to light using a light exposing instrument available from ASML (XT: 1400, NA 0.93) and post-baked at a temperature of about 110° C. for about 60 seconds. Next, the photoresist was developed using an aqueous solution of 2.38 wt % tetramethylammonium hydroxide (TMAH) to form a photoresist pattern.

Dry etching was performed using the photoresist pattern as a mask, and a $CF_4/CHF_3$ mixture gas. The etching conditions included 20 milliTorr (mT) of a chamber pressure, 1,800 W of a RT power, a 4/10 volume ratio of $CF_4/CHF_3$, and an etching time of about 120 seconds.

$O_2$ ashing and wet stripping were performed on a post hardmask and an organic material remaining after the dry etching to obtain a silicon substrate, on which a desired silicon oxide pattern was formed as a final pattern.

Example 4: Preparation of Silicon Substrate on which Silicon Oxide Pattern was Formed A silicon substrate, on which a silicon oxide pattern was formed, prepared in the same manner as in Example 3, except that the hardmask composition prepared in Example 2 was used in place of the hardmask composition prepared in Example Examples 5 and 6: Preparation of Hardmask Composition Hardmask compositions were prepared in the same manner as in Example 2, except that the OH-functionalized fullerene (C60) prepared in Preparation Example 5 was mixed with the COOH-functionalized GNP prepared in Preparation Example 4 at a weight ratio of about 1:3 and about 1:2, respectively in the hardmask composition.

Examples 7 and 8: Preparation of Silicon Substrate on which Silicon Oxide Pattern was Formed Silicon substrates, on which a silicon oxide pattern was formed, were prepared in the same manner as in Example 4, except that the hardmask compositions prepared in Examples 5 and 6 were respectively used in place of the hardmask composition prepared in Example 1.

Comparative Example 1

10 g of a graphite powder was added to 50 mL of sulfuric acid ($H_2SO_4$), and the mixture was stirred at a temperature of 80° C. for about 4 hours to about 5 hours.

The stirred mixture was diluted with 1 L of deionized water and stirred for about 12 hours. Then, the resultant was filtered to obtain pre-treated graphite.

Phosphorus pentoxide ($P_2O_5$) was dissolved in 80 mL of water, 480 mL of sulfuric acid was added thereto, 4 g of the pre-treated graphite was added thereto, and 24 g of potassium permanganate ($KMnO_4$) was added thereto. The mixture was stirred and sonicated for about 1 hour, and 600 mL of water ($H_2O$) was added thereto. When 15 mL of hydrogen peroxide ($H_2O_2$) was added to the reaction mixture, color of the reaction mixture changed from purple to light yellow, and the mixture was sonicated while being stirred. The reaction mixture was filtered to remove non-oxidized remaining graphite. In order to remove manganese (Mn) from the filtrate, 200 mL of HCl, 200 mL of ethanol, and 200 mL of water were added to the filtrate, and the mixture was stirred. The mixture was centrifuged to obtain a 2D carbon nanostructure precursor.

0.5 g of the 2D carbon nanostructure precursor thus obtained was dispersed in 1 L of water to obtain a hardmask composition. While spray coating a silicon substrate, on which a silicon oxide had been formed, with the hardmask composition, the substrate was heat-treated at a temperature of 200° C. Subsequently, the resultant was baked at a temperature of 400° C. for 1 hour, and vacuum heat-treated at a temperature of 600° C. for 1 hour to prepare a hardmask having a thickness of about 200 nm and containing a GNP.

Comparative Example 2 fullerene was mixed with dichlorobenzene as a solvent to obtain a hardmask composition. In the hardmask composition, an amount of the dichlorobenzene was 10 mL for 1 g of fullerene.

In this case, solubility of fullerene to the solvent was poor, and thus it was difficult to obtain a homogeneous hardmask composition. A hardmask containing fullerene was prepared in the same manner as in Comparative Example 1, except that the foregoing hardmask composition was used in place of the hardmask composition prepared in Example 1.

In Comparative Example 2, it was difficult to form a hardmask in film form because solubility of fullerene to the solvent was poor.

Comparative Example 3

Fullerene (C60), a GNP (particle size: 7 nm to 8 nm), and solvent were mixed together to obtain a hardmask composition. The fullerene was mixed with the GNP at a weight ratio of about 2:8.

A hardmask was prepared in the same manner as in Comparative Example 1, except that the foregoing hardmask composition was used in place of the hardmask composition prepared in Comparative Example 1.

Evaluation Example 1: Etching Resistance

Etching resistance was evaluated by measuring a thickness difference between before and after the dry etching on the hardmasks and the silicon oxide layers using the hardmasks prepared in Examples 3 and 4 and Comparative Examples 1 and 3 and calculating an etch rate and an etching selection ratio according to Equations 1 and 2. The results of etching resistance evaluation are shown in Table 1. In Equation 1, the thin film comprises only the hardmask.

Etch rate=(An initial thickness of the thin film−a thickness of the thin film after etching)/etching time (sec)Equation 2   Equation 1

Etching selection ratio=(A thickness of the silicon oxide before etching on a silicon oxide−a thickness of the silicon oxide after etching on a silicon oxide)/(a thickness of the hardmask before etching on a hardmask−a thickness of the hardmask after etching on a hardmask)×100

TABLE 1

| Example | Etch rate (nm/sec) | Etching selectivity ratios |
| --- | --- | --- |
| Example 3 | 0.8 | 2.5 |
| Example 4 | 0.8 | 2.5 |
| Comparative Example 1 | 1.0 | 2 |
| Comparative Example 3 | 1.0 | 2 |

Referring to Table 1, it was found that the hardmasks prepared in Examples 3 and 4 had low etch rates and high etching selectivity ratios, as compared with those of the hardmasks prepared in Comparative Examples 1 and 3. Accordingly, the hardmask compositions used in Examples 3 and 4 were found to have improved etching resistance, as compared with the hardmask compositions used in Comparative Examples 1 and 3.

Evaluation Example 2: Density

Film densities of the hardmasks prepared in Examples 3 and 4 and Comparative Examples 1 and 3 are shown in Table 2.

TABLE 2

| Example | Film density (g/cm$^3$) |
| --- | --- |
| Example 3 | 1.8 |
| Example 4 | 1.8 |
| Comparative Example 1 | 1.4 |
| Comparative Example 3 | 1.4 |

Evaluation Example 3: TEM Analysis

TEM analysis was performed on the composite of Example 1 containing the OH-functionalized fullerene (C60) prepared in Preparation Example 5 and the COOH-functionalized GNP prepared in Preparation Example 4 and the GNP prepared in Comparative Example 1. The TEM analysis was performed by using Osiris available from Tecnai Co., Ltd.

Figure 6A:
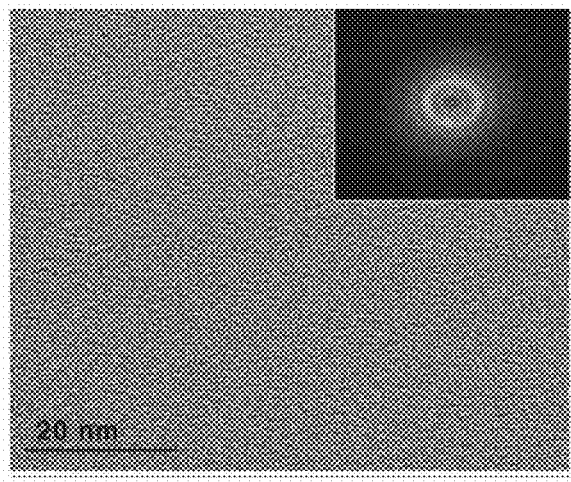
FIGS. 6A and 6B respectively show Fourier transform (FT) transmission electron microscope (TEM) images of a composite of Example 1 and a graphene nanoparticle (GNP) of Comparative Example 1.
Figure 6B:
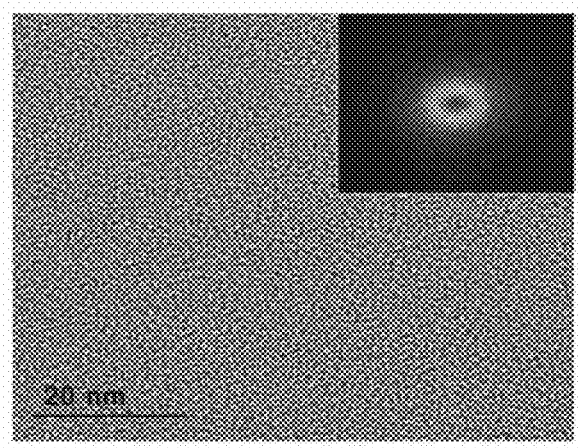

FIGS. 6A and 6B respectively show Fourier transform (FT) TEM images of the composite of Example 1 and the GNP of Comparative Example 1.

As shown in FIGS. 6A and 6B, a crystalline ring pattern was observed in the composite of Example 1, whereas a crystalline ring pattern was not observed in the GNP of Comparative Example 1.

Evaluation Example 4: Raman Spectrum Analysis

Raman spectroscopy analysis was performed for the OH-functionalized fullerene (C60) prepared in Preparation Example 5. Raman spectroscopy analysis was performed by using RM-1000 Invia instrument (514 nm, Ar ion laser). The results of Raman spectroscopy analysis is shown in FIG. 7.

Figure 7:
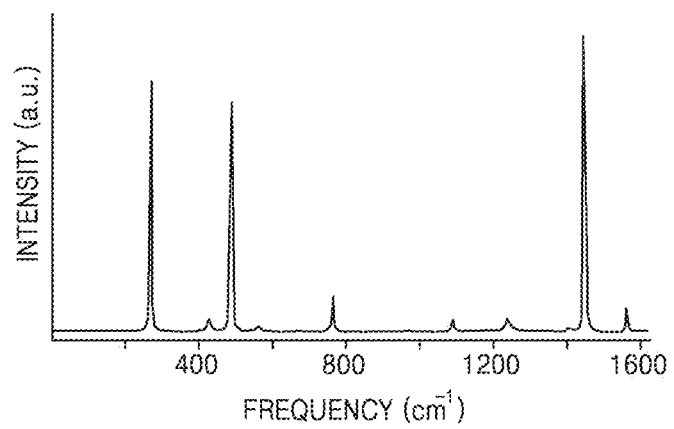
FIG. 7 shows a Raman spectroscopy spectrum for OH-functionalized fullerene (C60) prepared in Preparation Example 5.

As shown in FIG. 7, the OH-functionalized fullerene (C60) prepared in Preparation Example 5 exhibited a maximum absorption peak observed at a Raman shift of about 1,459 cm$^{-1}$. The maximum absorption peak at about 1,459 cm$^{-1}$ has relevance to a pentagonal pinch mode. When a composite is included in a hardmask, the composite including fullerene having a maximum absorption peak as such, the hardmask may have excellent etching resistance.

Evaluation Example 5: Transmittance

Transmittances of the hardmasks prepared in Examples 3 and 4 and Comparative Examples 1 to 3 were measured by light exposure at a wavelength of about 633 nm.

As the result, it was found that transmittances of the hardmask patterns prepared in Examples 3 and 4 were improved about 99% or higher relative to transmittances of the hardmask patterns prepared in Comparative Examples 1 to 3. When a hardmask having improved transmittance as such is used, sensing of a hardmask pattern and an align mask for patterning an etching layer may become easier, and thus the etching layer may be patterned at a finer and more compact pattern size.

Evaluation Example 6: Pattern Shape Analysis

Etching was performed using the hardmasks prepared in Examples 3, 4, 7, and 8 and Comparative Examples 1 to 3. Then, surfaces of silicon substrates on which a silicon oxide pattern had been formed were observed using field emission scanning electron microscope (FE-SEM). The results thereof are shown in Table 3.

TABLE 3

| Example | Pattern shape of the hardmask after etching thereon | Pattern shape of the silicon oxide after etching thereon |
| --- | --- | --- |
| Example 3 | Vertical shape | Vertical shape |
| Example 4 | Vertical shape | Vertical shape |
| Example 7 | Vertical shape | Vertical shape |
| Example 8 | Vertical shape | Vertical shape |
| Comparative Example 1 | Arc shape | Tapered shape |
| Comparative Example 2 | Arc shape | Tapered shape |
| Comparative Example 3 | Arc shape | Tapered shape |

As shown in Table 3, the pattern shapes of the silicon oxides formed using the hardmasks of Examples 3, 4, 7, and 8 were found to be vertical, whereas those formed using the hardmasks Comparative Examples 1 to 3 were not vertical.

As apparent from the foregoing description, a hardmask including a hardmask composition according to one or more example embodiments may have desirable stability, and improved etching resistance and mechanical strength relative to those of a polymer or an amorphous carbon generally used, and the hardmask may be more easily removed after an etching process. When the hardmask is used, a pattern may be finely and evenly formed, and efficiency of a semiconductor process may be improved relative to when the hardmask is not used.

It should be understood that embodiments described herein should be considered in a descriptive sense only and not for purposes of limitation. Descriptions of features or aspects within each embodiment should typically be considered as available for other similar features or aspects in other embodiments.

While one or more example embodiments have been described with reference to the figures, it will be understood by those of ordinary skill in the art that various changes in form and details may be made therein without departing from the spirit and scope as defined by the following claims.

What is claimed is:

1. A hardmask composition comprising:
a solvent; and at least one of
a derivative mixture including a derivative of a two-dimensional (2D) carbon nanostructure and a derivative of a zero-dimensional (0D) carbon nanostructure, or
a composite including a 2D carbon nanostructure and a 0D carbon nanostructure, wherein
the hardmask composition includes the composite, and
the composite is a structure in which the 2D carbon nanostructure is bound to the 0D carbon nanostructure by a linker, and
the 2D carbon nanostructure is at least one of graphene, graphene quantum dots, reduced graphene oxide, and a heteroatom derivative thereof,
the 2D carbon nanostructure is a GNP,
an intensity ratio of a D mode peak to a G mode peak obtained from Raman spectroscopy analysis of the GNP is greater than 0 and less than or equal to 2,
an intensity ratio of a 2D mode peak to a G mode peak is 0.01 or greater,
the 2D carbon nanostructure is mixed with the 0D carbon nanostructure at a ratio of about 3:1 to about 5:1, and
a size of the 2D carbon nanostructure is in a range of about 1 nm to 10 nm.

2. The hardmask composition of claim 1, wherein
the linker is at least one of an ester group (—C(═O)O—), an ether group (—O—), a thioether group (—S—), a carbonyl group ((—C)═O)—), an amide group (—C(═O)NH—), and an imide group; or
the linker is an organic group derived from at least one of an ester group (—C(═O)O—), an ether group (—O—), a thioether group (—S—), a carbonyl group ((—C)═O)—), an amide group (—C(═O)NH—), and an imide group.

3. The hardmask composition of claim 1, wherein
the composite is a product of a reaction between the 0D carbon nanostructure including a first reactive functional group and the 2D carbon nanostructure including a second reactive functional group, and
the first reactive functional group and the second reactive functional group independently each include at least one of a halogen atom, a hydroxyl group, an alkoxy group, a cyano group, an amino group, an azide group, a carboxamidine group, a hydrazino group, a hydrazono group, a carbamoyl group, a thiol group, an ester group, a carboxylic acid group or a salt thereof, a sulfonic acid group or a salt thereof, and a phosphoric acid group or a salt thereof.

4. The hardmask composition of claim 1, wherein
the 0D carbon nanostructure is at least one of a fullerene, a boron buckyball, a carborane, and a derivative thereof.

5. The hardmask composition of claim 1, wherein a content of carbon in the 2D carbon nanostructure is in a range of about 75 percent by weight (wt %) to about 95 wt %.

6. The hardmask composition of claim 1, wherein a number of layers of the GNP is greater than 0 and less than or equal to about 300.

7. The hardmask composition of claim 1, wherein the 0D carbon nanostructure is a fullerene or a derivative thereof, and a number of carbon atoms in the 0D carbon nanostructure is one of 60, 70, 76, 78, 82, 82, and 84.

8. The hardmask composition of claim 7, wherein, according to analysis of the fullerene by Raman spectroscopy, a maximum absorption peak is observed at a Raman shift of about 1,455 centimeters$^{-1}$ (cm$^{-1}$) to about 1,500 cm$^{-1}$.

9. The hardmask composition of claim 1, wherein the 2D carbon nanostructure is a 2D sheet having a size to thickness ratio in a range of about 3 to about 30.

10. The hardmask composition of claim 1, wherein an sp$^2$ carbon fraction of the GNP is equal to an sp$^3$ carbon fraction thereof or equal to a multiple of an sp$^3$ carbon fraction thereof.

11. The hardmask composition of claim 1, wherein the hardmask composition includes at least one of a compound represented by Formula 2, a compound represented by Formula 3, and a product of a reaction between graphene to which a hydroxyl group is bound and a fullerene to which a carboxyl group is bound:

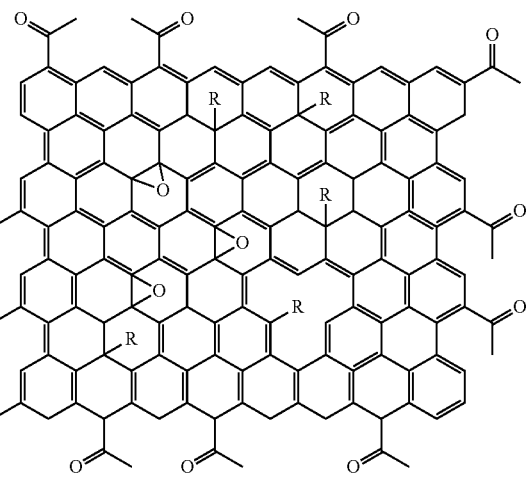

Formula 2 wherein, in Formula 2, R indicates a group represented by Formula 2a:

Formula 2a

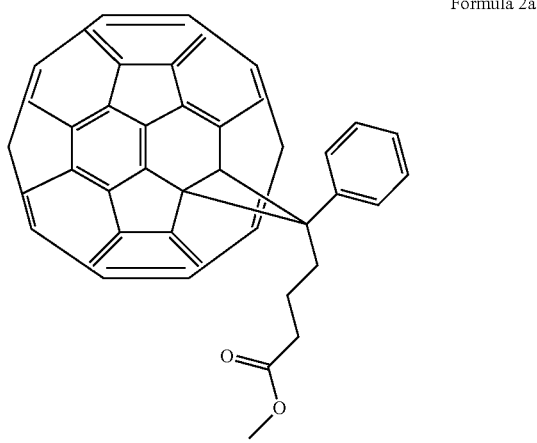

the first material includes one of a monomer containing an aromatic ring and a polymer including a repeating unit containing the monomer, and the second material includes one of hexagonal boron nitride, a chalcogenide-based material, and a precursor thereof.

14. A method of forming a pattern, the method comprising:
forming an etching layer on a substrate;
forming a hardmask on the etching layer, the forming the hardmask including providing the hardmask composition of claim 1 on the etching layer, wherein the hardmask includes the composite of the 2D carbon nanostructure and the 0D carbon nanostructure;
forming a photoresist layer on the hardmask;
forming a hardmask pattern, the forming the hardmask pattern including etching the composite using the photoresist layer as an etching mask; and
etching the etching layer using the hardmask pattern as an etching mask.

15. The method of claim 14, further comprising:

Formula 3

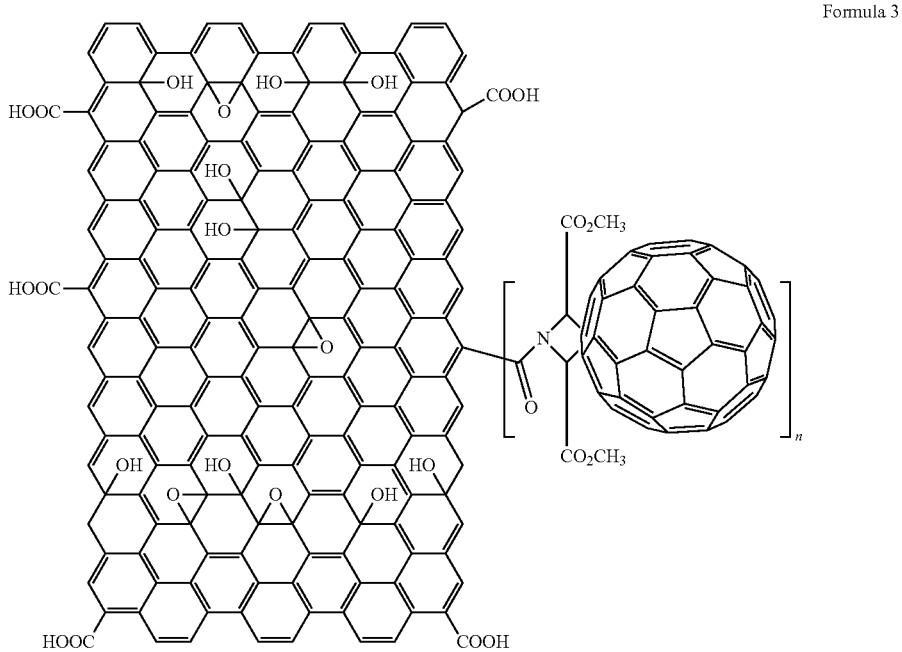

wherein, in Formula 3, n is an integer from 1 to 10.

12. The hardmask composition of claim 1, wherein the solvent is at least one of water, methanol, isopropanol, ethanol, N,N-dimethylformamide, N-methylpyrrolidone, dichloroethane, dichlorobenzene, dimethylsulfoxide, xylene, aniline, propylene glycol, propylene glycol diacetate, 3-methoxyl,2-propanediol, diethylene glycol, gamma-butyrolactone, acetylacetone, cyclohexanone, propylene glycol monomethyl ether acetate, o-dichlorobenzene, nitromethane, tetrahydrofuran, nitromethane, dimethyl sulfoxide, nitrobenzene, butyl nitrite, methyl cellosolve, ethyl cellosolve, diethylether, diethylene glycol methyl ether, diethylene glycol ethyl ether, dipropylene glycol methyl ether, toluene, hexane, methylethylketone, methyl isobutylketone, hydroxymethylcellulose, and heptane.

13. The hardmask composition of claim 1 further comprising:
one of a first material, a second material, and a mixture of the first material and the second material, wherein performing a heat treatment on the hardmask composition during or after the providing of the hardmask composition on the etching layer.

16. The method of claim 14, wherein a thickness of the hardmask is in a range of about 10 nm to about 10,000 nm.

17. The method of claim 14, wherein the forming the hardmask includes using at least one of spin coating, air spraying, electrospraying, dip coating, spray coating, doctor blade coating, and bar coating during the providing the hardmask composition.

18. The method of claim 14, wherein the forming the hardmask includes mixing the derivative of the 2D carbon nanostructure, the derivative of the 0D carbon nanostructure, and the solvent.

19. The method of claim 18, wherein
the derivative of the 2D carbon nanostructure is at least one of a COOH-functionalized GNP and a GNP precursor, and
the derivative of the 0D carbon nanostructure is an OH-functionalized fullerene.

20. The method of claim 14, wherein the forming the hardmask includes
- mixing the solvent and the composite including the 2D carbon nanostructure and the 0D carbon nanostructure, or
- mixing the solvent, the derivative of the 2D carbon nanostructure, and the derivative of the 0D carbon nanostructure.

21. The method of claim 14, wherein
the forming the hardmask pattern includes forming a laminate structure, and
the laminate structure includes the 2D carbon nanostructure and the 0D carbon nanostructure.

22. A hardmask comprising:
a composite including a 2D carbon nanostructure and a 0D carbon nanostructure, wherein
the composite is a structure in which the 2D carbon nanostructure is bound to the 0D carbon nanostructure by a linker,
the 2D carbon nanostructure is at least one of graphene, graphene quantum dots, reduced graphene oxide, and a heteroatom derivative thereof,
the 2D carbon nanostructure is a GNP,
an intensity ratio of a D mode peak to a G mode peak obtained from Raman spectroscopy analysis of the GNP is greater than 0 and less than or equal to 2,
an intensity ratio of a 2D mode peak to a G mode peak is 0.01 or greater,
the 2D carbon nanostructure is mixed with the 0D carbon nanostructure at a ratio of about 3:1 to about 5:1,
a size of the 2D carbon nanostructure is in a range of about 1 nm to 10 nm.

23. A hardmask composition comprising:
at least one of a two-dimensional (2D) carbon nanostructure and a derivative of the 2D carbon nanostructure; and
at least one of a zero-dimensional (0D) carbon nanostructure and a derivative of the 0D carbon nanostructure, wherein
the 2D carbon nanostructure is a GNP,
an intensity ratio of a D mode peak to a G mode peak obtained from Raman spectroscopy analysis of the GNP is greater than 0 and less than or equal to 2,
an intensity ratio of a 2D mode peak to a G mode peak is 0.01 or greater, and
the at least one of a two-dimensional (2D) carbon nanostructure and a derivative of the 2D carbon nanostructure is mixed with the at least one of a zero-dimensional (0D) carbon nanostructure and a derivative of the 0D carbon nanostructure at a ratio of about 3:1 to about 5:1, and
a size of the 2D carbon nanostructure is in a range of about 1 nm to 10 nm.

24. The hardmask composition of claim 23, wherein
the hardmask composition include the 0D carbon nanostructure, and the 0D carbon nanostructure is at least one of a fullerene, a boron buckyball, a carborane, and a derivative thereof.

25. The hardmask composition of claim 23, wherein
the hardmask composition include the 2D carbon nanostructure.

26. The hardmask composition of claim 23, wherein
the at least one of the 2D carbon nanostructure and the derivative of the 2D carbon nanostructure is the 2D carbon nanostructure,
the at least one of the 0D carbon nanostructure and the derivative of the 0D carbon nanostructure is the 0D carbon nanostructure, and
the 2D carbon nanostructure and the 0D carbon nanostructure are connected to each other by a linker functional group.

* * * * *